United States Patent
Hansen

(10) Patent No.: US 8,786,824 B2
(45) Date of Patent: Jul. 22, 2014

(54) SOURCE-MASK OPTIMIZATION IN LITHOGRAPHIC APPARATUS

(75) Inventor: Steven George Hansen, Phoenix, AZ (US)

(73) Assignee: ASML Netherlands B.V., Veldhoven (NL)

(*) Notice: Subject to any disclaimer, the term of this patent is extended or adjusted under 35 U.S.C. 154(b) by 996 days.

(21) Appl. No.: 12/813,456

(22) Filed: Jun. 10, 2010

(65) Prior Publication Data

US 2010/0315614 A1   Dec. 16, 2010

Related U.S. Application Data

(60) Provisional application No. 61/185,931, filed on Jun. 10, 2009.

(51) Int. Cl.
| | |
|---|---|
| G03B 27/54 | (2006.01) |
| G03B 27/68 | (2006.01) |
| G03B 27/52 | (2006.01) |
| G03B 27/32 | (2006.01) |
| G03B 27/42 | (2006.01) |

(52) U.S. Cl.
USPC ............. 355/67; 355/52; 355/53; 355/55; 355/77

(58) Field of Classification Search
USPC ............ 355/53, 55, 77, 52, 67–71; 430/5, 30, 430/22, 311, 312; 716/51, 54, 55; 703/13, 703/22
See application file for complete search history.

(56) References Cited

U.S. PATENT DOCUMENTS

| | | | |
|---|---|---|---|
| 6,839,125 B2 | 1/2005 | Hansen | |
| 7,016,017 B2 | 3/2006 | Hansen | |
| 7,266,803 B2 | 9/2007 | Chou et al. | |
| 7,864,301 B2* | 1/2011 | Socha | 355/77 |
| 8,542,340 B2* | 9/2013 | Ye et al. | 355/52 |
| 2002/0140920 A1 | 10/2002 | Rosenbluth et al. | |
| 2004/0141167 A1* | 7/2004 | Sasaki | 355/67 |
| 2004/0265707 A1 | 12/2004 | Socha | |
| 2007/0031744 A1* | 2/2007 | Crouse et al. | 430/30 |
| 2008/0186468 A1* | 8/2008 | Hansen et al. | 355/67 |
| 2008/0252870 A1* | 10/2008 | Jeunink et al. | 355/53 |

OTHER PUBLICATIONS

Führer, T. et al., "Direct Optimization Approach for Lithographic Process Conditions", J. Micro/Nanolith, MEMS MOEMS, vol. 6(3), (2007) pp. 031006-1-031006-20.

(Continued)

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

A method for configuring an illumination source of a lithographic apparatus, the method including dividing the illumination source into pixel groups, each pixel group including one or more illumination source points; selecting an illumination shape to expose a pattern, the illumination shape formed with at least one pixel group; ranking the pixel groups according to how a change in state of a pixel group affects a lithographic metric; and for each pixel group in order of ranking, determining whether to adjust the illumination shape by changing the state of the pixel group based on a calculation of the lithographic metric as a result of a change in state of the pixel group.

20 Claims, 15 Drawing Sheets

(56) References Cited

OTHER PUBLICATIONS

Fühner, T. et al., "Efficient Optimization of Lithographic Process Conditions Using a Distributed, Combined Global/Local Search Approach", Optical Microlithography XIX, edited by Donis G. Flagello, Proc. of SPIE, vol. 6154 (2006), pp. 61543S-1-61543S-12.

Granik, Y., "Illuminator Optimization Methods in Microlithography", Novel Optical Systems Design and Optimization VII, edited by Jose M. Sasian et al., Proc. of SPIE, vol. 5524 (2004), pp. 217-229.

Mack, C.A., "The Lithography Expert: Using the Normalized Image Log-Slope Part 6: Development Path", Solid State Technology (2009), http://www.solid-stage.com/display_article/176922/28/none/none/Feat/The-Lithography-Expert:-Using-the-normalized-image-log-slope-Part-6:-Development-pat, 2 pages.

Rosenbluth, A.E. et al., "Global Optimization of the Illumination Distribution to Maximize Integrated Process Window", Optical Microlithography XIX, edited by Donis G. Flagella, Proc. of SPIE, vol. 6154 (2006), pp. 61540H-1-61540H-12.

* cited by examiner

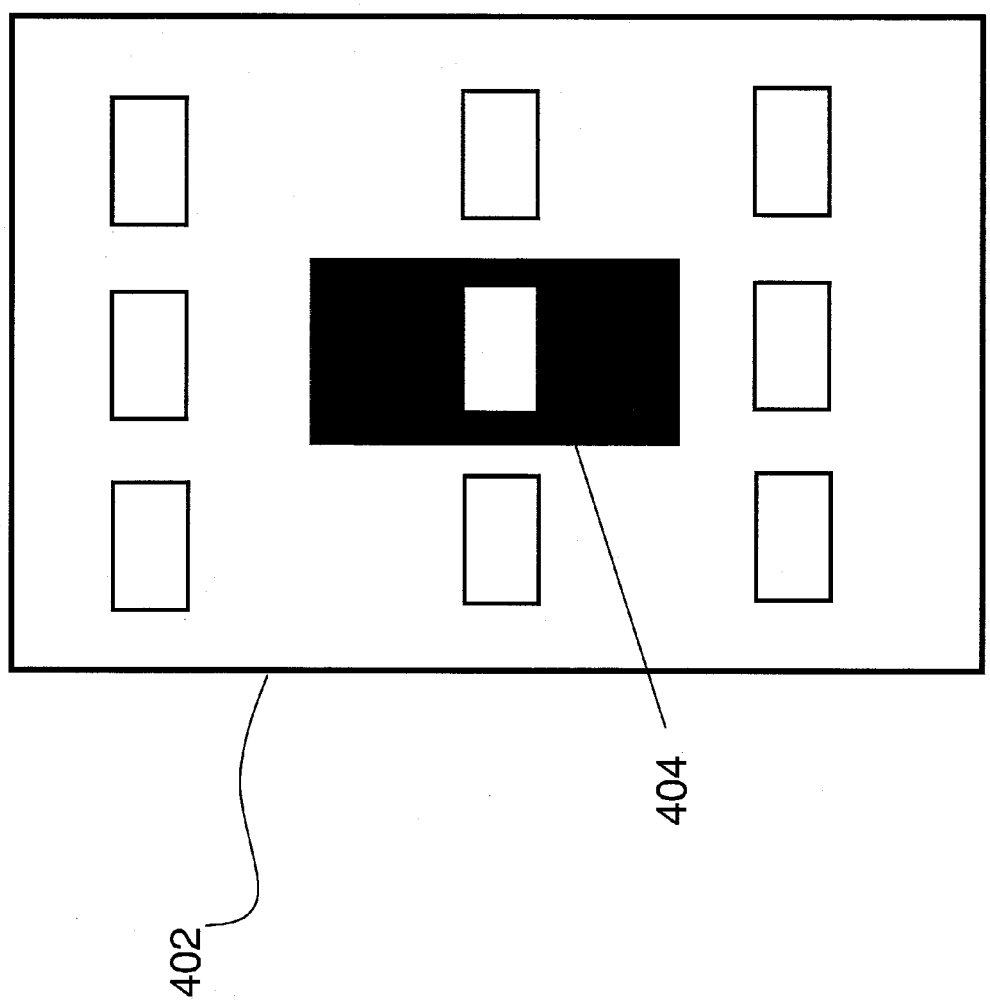

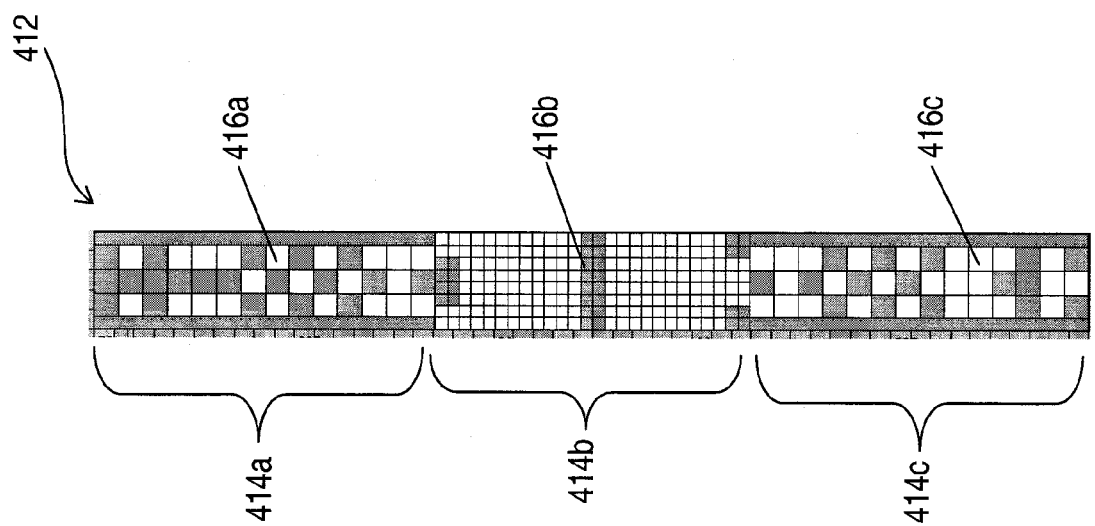

SOURCE-MASK OPTIMIZATION IN LITHOGRAPHIC APPARATUS

CROSS-REFERENCE TO RELATED APPLICATIONS

The present application claims the benefit of U.S. Provisional Patent Application No. 61/185,931, titled, "Lithographic Apparatus and Device Manufacturing Method," filed on Jun. 10, 2009, which is incorporated herein by reference in its entirety.

FIELD

The present invention relates to a lithographic apparatus and a device manufacturing method, and more particularly, to source-mask-optimization methods in the lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) of a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Photolithography is widely recognized as one of the key steps in the manufacture of ICs and other devices and/or structures. At present, no alternative technology seems to provide the desired pattern architecture with similar accuracy, speed, and economic productivity. However, as the dimensions of features made using photolithography become smaller, photolithography is becoming one of the most, if not the most, critical gating factors for enabling miniature IC or other devices and/or structures to be manufactured on a truly massive scale.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size of a feature arranged in an array with a 1:1 duty cycle (i.e., equal lines and spaces or holes with size equal to half the pitch).

It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to improve resolution performance of a lithographic system, various tools may be used. In one approach, illumination systems are refined by considering alternatives to full circular illumination apertures. A system where illumination is obliquely incident on the patterning device at an angle so that the zero-th and first diffraction orders are distributed on alternative sides of the optical axis may allow for improvements. Such an approach is generally referred to as off-axis illumination. Off-axis illumination improves resolution by illuminating the patterning device with radiation that is at an angle to the optical axis of the projection system. Examples of off-axis illumination include multipole illumination and annular illumination. The incidence of the radiation on the patterning device, which acts as a diffraction grating, improves the contrast of the image by transmitting more of the diffracted orders through the projection system. Off-axis illumination techniques used with conventional masks produce resolution enhancement effects similar to resolution enhancement effects obtained with phase shifting masks. Besides off-axis illumination, other currently available RET include optical proximity correction (OPC) of optical proximity errors (OPE), and sub-resolution assist features (SRAF). Each technique may be used alone, or in combination with other techniques to enhance the resolution of the lithographic projection tool.

As illumination systems have evolved from producing conventional to annular, and on to quadrupole and more complicated illumination configurations, the control parameters have concurrently become more numerous. In a conventional illumination pattern, a circular area including the optical axis is illuminated, the only adjustment to the pattern being to alter the outer radius ($\sigma_r$) of the circular illumination. Annular illumination requires the definition of an inner radius ($\sigma_c$) in order to define the illuminated ring. For multipole patterns, the number of parameters which can be controlled continues to increase. For example, in a quadrupole illumination configuration, in addition to the two radii, a pole angle $\alpha$ defines the angle subtended by each pole between the selected inner and outer radii.

Recent developments in illumination systems include the advent of freely tunable illumination sources. Freely tunable illumination sources can provide illumination shapes that are arbitrarily or nearly arbitrarily defined, thereby allowing even finer controls over illumination patterns. Illumination shapes of any complexity can be produced by simple apertures, gray-tone plates, or diffractive optical elements (DOEs). Efficient production of tunable off-axis illumination can be achieved through the use of an aerial illumination system such as those which uses a zoom/axicon design. Illumination systems may also use tunable mirror systems to enable precise control and adjustment of complex shapes.

Concurrently, patterning device (e.g., mask) technology has been evolving as well. Binary intensity masks have given way to phase shift masks and other advanced designs. While a binary mask simply transmits, reflects or blocks imaging radiation at a given point, a phase shift mask may attenuate some radiation or it may transmit or reflect the light after imparting a phase shift, or both. Phase shift masks have been used in order to image features which are on the order of the imaging radiation's wavelength or smaller, since diffraction effects at these resolutions can cause poor contrast and end-of-line errors, among other problems.

In light of recent developments that provide an increasing number of tuning and adjustment options for both illumination sources and masks, approaches for determining the optimal combination of source and mask configuration are desired.

SUMMARY

It is desirable to optimize the combination of the illumination source and the mask of a lithographic apparatus to print features with greater precision.

In an embodiment of the invention, there is provided a method for configuring an illumination source and a mask of a lithographic apparatus, the method including: dividing the illumination source into pixel groups, each pixel group including one or more illumination source points; dividing the mask into mask tiles; selecting an illumination shape, the illumination shape formed with at least one pixel group; selecting a mask pattern; selecting a lithographic model for simulation; ranking the pixel groups and the mask tiles; and for each pixel group and each mask tile in order of ranking, performing the steps of: determining whether to adjust the illumination shape or the mask pattern based on the results of a calculation of a lithographic metric, the calculation based on a simulation using the selected lithographic model and an alternation of the pixel group or mask tile; and adjusting the illumination or mask pattern by altering the pixel group or mask tile if it is determined that the illumination shape or mask pattern is to be adjusted.

In an embodiment of the invention, there is provided a computer product having machine executable instructions, the instructions being executable by a machine to perform a method for configuring an illumination source and a mask of a lithographic apparatus, the method including: dividing the illumination source into pixel groups, each pixel group including one or more illumination source points; dividing the mask into mask tiles; selecting an illumination shape, the illumination shape formed with at least one pixel group; selecting a mask pattern; selecting a lithographic model for simulation; ranking the pixel groups and the mask tiles; and for each pixel group and each mask tile in order of ranking, performing the steps of: determining whether to adjust the illumination shape or the mask pattern based on the results of a calculation of a lithographic metric, the calculation based on a simulation using the selected lithographic model and an alternation of the pixel group or mask tile; and adjusting the illumination or mask pattern by altering the pixel group or mask tile if it is determined that the illumination shape or mask pattern is to be adjusted.

In an embodiment of the invention, there is provided a lithographic apparatus including an illumination system configured to condition a beam of radiation; a substrate table configured to hold a substrate; a projection system configured to project a beam of radiation patterned by a patterning device onto a surface of the substrate; and a processor to perform a method for configuring an illumination source and a mask of a lithographic apparatus, the method including: dividing the illumination source into pixel groups, each pixel group including one or more illumination source points; dividing the mask into mask tiles; selecting an illumination shape, the illumination shape formed with at least one pixel group; selecting a mask pattern; selecting a lithographic model for simulation; ranking the pixel groups and the mask tiles; and for each pixel group and each mask tile in order of ranking, performing the steps of: determining whether to adjust the illumination shape or the mask pattern based on the results of a calculation of a lithographic metric, the calculation based on a simulation using the selected lithographic model and an alternation of the pixel group or mask tile; and adjusting the illumination or mask pattern by altering the pixel group or mask tile if it is determined that the illumination shape or mask pattern is to be adjusted.

In an embodiment of the invention, there is provided a method for configuring an illumination source of a lithographic apparatus, the method including: dividing the illumination source into pixel groups, each pixel group including one or more illumination source points; selecting an illumination shape, the illumination shape formed with at least one pixel group; selecting a lithographic model for simulation; for each pixel group in the illumination source, determining a linear sensitivity response, the linear sensitivity response indicating how a lithographic metric changes in response to an adjustment of the illumination shape as a result of an adjustment to the pixel group, the linear sensitivity response calculated based on a simulation using the lithographic model; based on the calculated linear sensitivity responses, adjusting the illumination source to achieve a desired lithographic metric value.

Further embodiments, features, and advantages of the present invention, as well as the structure and operation of the various embodiments of the present invention, are described in detail below with reference to the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4A illustrates an exemplary mask pattern.

FIG. 4C is a schematic representation of an unit cell that contains mask tiles of two different sizes.

DETAILED DESCRIPTION

Figure 1:
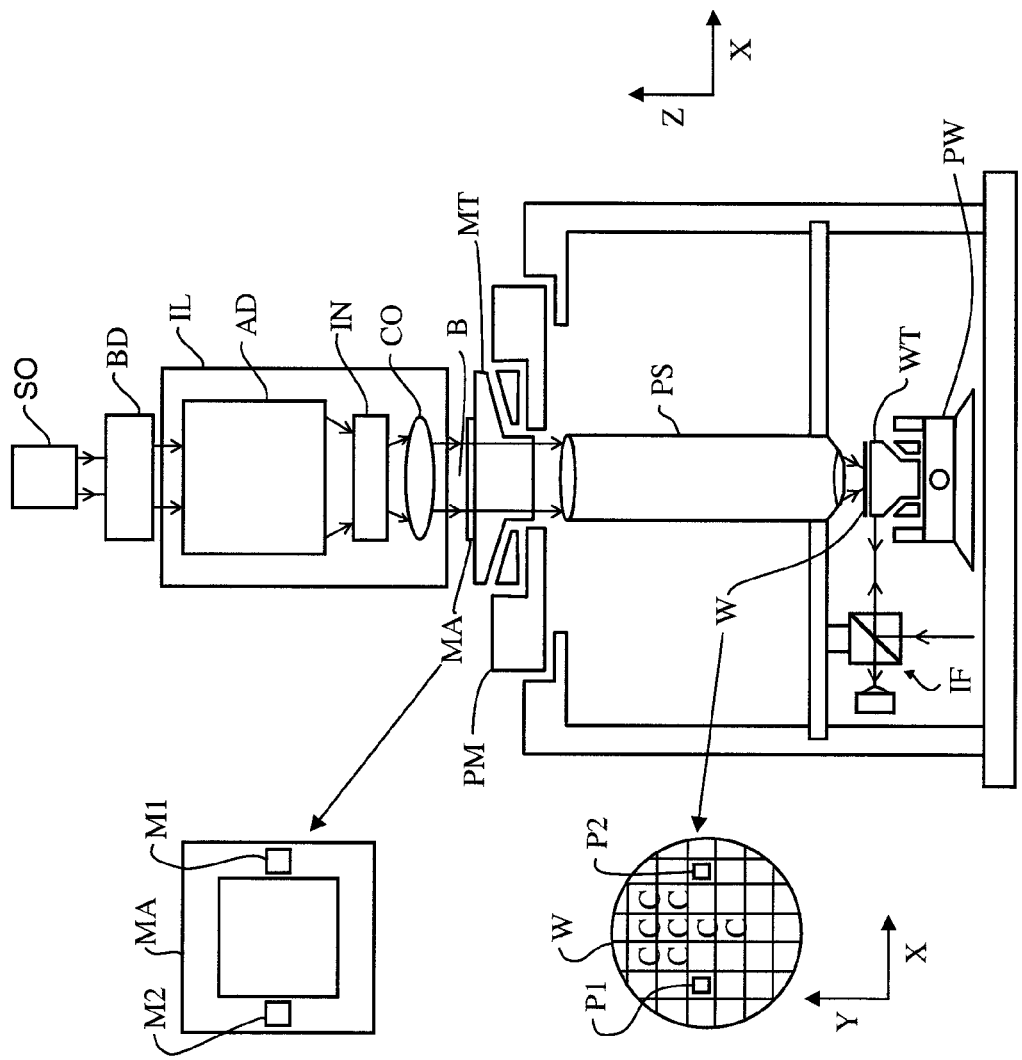
FIG. 1 schematically depicts a lithographic apparatus in accordance with an embodiment of the invention.

FIG. 1 schematically depicts a lithographic apparatus according to an embodiment of the invention. The apparatus includes an illumination system (illuminator) IL adapted to condition a beam B of radiation (e.g., UV radiation) and a support structure (e.g., a mask table) MT configured to hold a patterning device (e.g., a mask) MA and connected to a first positioning device PM configured to accurately position the patterning device with respect to the projection system PS. The apparatus also includes a substrate table (e.g., a wafer table) WT configured to hold a substrate (e.g., a resist-coated wafer) W and connected to a second positioning device PW configured to accurately position the substrate with respect to the projection system PS. The apparatus also includes a projection system (e.g., a refractive projection lens) PS adapted to image a pattern imparted to the beam B by the patterning device MA onto a target portion C (e.g., including one or more dies) of the substrate W.

As depicted here, the apparatus is of a transmissive type (e.g., employing a transmissive mask). Alternatively, the apparatus may be of a reflective type (e.g., employing a programmable mirror array of a type as referred to below).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD, including, for example, suitable directing mirrors and/or a beam expander. In other cases, the source may be an integral part of the apparatus, for example when the source is a mercury lamp. The source SO and the illuminator IL, together with the beam delivery system BD if required, may be referred to as a radiation system.

The projection system PS may include a diaphragm with an adjustable clear aperture used to set the numerical aperture of the projection system PS at substrate level to a selected value. The maximum selectable numerical aperture, or, in the case of a fixed clear aperture, the fixed numerical aperture, will be referred to as $NA_{PS}$. At patterning device (e.g., mask) level, a corresponding angular capture range within which the projection system PS is capable of receiving rays of the beam of radiation is given by the object-side numerical aperture of the projection system PS, referred to as $NA_{PSOB}$. The maximum object-side numerical aperture of the projection system PS is denoted by $NA_{PSOB}$. Projection systems in optical lithography are commonly embodied as reduction projection systems with a reduction ratio M of, for example, 5× or 4×. A numerical aperture $NA_{PSOB}$ is related to $NA_{PS}$ through the reduction ratio M by $NA_{PSOB}=NA_{PS}/M$.

The beam of radiation B provided by the illumination system IL to the patterning device MA includes a plurality of radiation rays that impinge onto the patterning device MA with a plurality of angles of incidence. These angles of incidence are defined with respect to the Z axis in FIG. 1. These rays can therefore be characterized by an illumination numerical aperture $NA_{IL}$, which is defined by $NA_{IL}=\sin$ (angle of incidence), where the index of refraction of the space upstream of the mask is assumed to be 1. However, instead of characterizing the illumination radiation rays by the numerical aperture $NA_{IL}$, the rays may alternatively be characterized by the radial positions of the corresponding points traversed by these rays in a pupil of the illumination system. The radial position is linearly related to $NA_{IL}$, and it is common practice to define a corresponding normalized radial position σ in a pupil of the illumination system by $\sigma=NA_{IL}/NA_{PSOB}$.

In addition to an integrator IN and a condensor CO, the illumination system typically includes an adjusting device AM configured to set an outer and/or inner radial extent (commonly referred to as σ-outer and σ-inner, respectively) of the intensity distribution in the pupil of the illumination system. The maximum numerical aperture of illumination radiation is then defined by $NA_{ILmax}=\sigma\text{-outer}*NA_{PSOB}$. In view of the normalization, when σ-outer=1, radiation rays traversing the edge of the illumination pupil (and hence having maximum illumination numerical aperture) can be captured (in the absence of diffraction by the patterning device (e.g., mask) MA) by the projection system PS, because then $NA_{ILmax}=NA_{PSOB}$.

The beam of radiation B is incident on the patterning device MA, which is held on the support structure MT. Having traversed the patterning device MA, the beam of radiation B passes through the projection system PS, which focuses the beam onto a target portion C of the substrate W. With the aid of the second positioning device PW and position sensor IF (e.g., an interferometric device), the substrate table WT can be moved accurately, e.g., so as to position different target portions C in the path of the beam B. Similarly, the first positioning device PM and another position sensor (which is not explicitly depicted in FIG. 1) can be used to accurately position the patterning device MA with respect to the path of the beam B, e.g., after mechanical retrieval from a mask library, or during a scan. In general, movement of the support structure MT and substrate table WT will be realized with the aid of a long-stroke module (coarse positioning) and a short-stroke module (fine positioning), which form part of one or both of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus may be used in the following preferred modes:

1. In step mode, the support structure MT and the substrate table WT are kept essentially stationary, while an entire pattern imparted to the beam of radiation is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam of radiation is projected onto a target portion C (i.e., a single dynamic exposure). The velocity and direction of the substrate table WT relative to the support structure MT is determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable minor array of a type as referred to above.

Combinations and/or variations of the above described modes of use or entirely different modes of use may also be employed.

In accordance with at least one embodiment of the invention, it is proposed to configure and optimize one or more lithographic process components of a lithographic apparatus. The one or more lithographic process components each includes divisions whose states may be altered.

In accordance with at least one embodiment of the invention, the at least one lithographic process component includes an illumination source of a lithographic apparatus and a mask of a lithographic apparatus, substantially as just described. The divisions of the illumination source are pixel groups of the illumination source. Each pixel group of the illumination source may include one or more illumination source points. An illumination shape of the illumination source is formed with at least one pixel group, and an alteration in state of a pixel group results in a modification to the illumination shape. In other words, an adjustment to the illumination source may be effected through a altering the state of a pixel group of the illumination source, which modifies the illumination shape of the illumination source. The divisions of the mask are mask tiles of the mask. An alteration in state of a mask tile results in a modification to the mask pattern. In other words, an adjustment to the mask may be effected by altering the state of a mask tile of the mask, which modifies the mask pattern. For ease of reference, an alteration in state of a pixel group of a mask tile will be referred to as "an alteration". Although the following discussion focuses on an embodiment where an illumination source and a mask are optimized, it will be appreciated that any other lithographic process component may be also be optimized in other embodiments of the invention.

Figure 2:
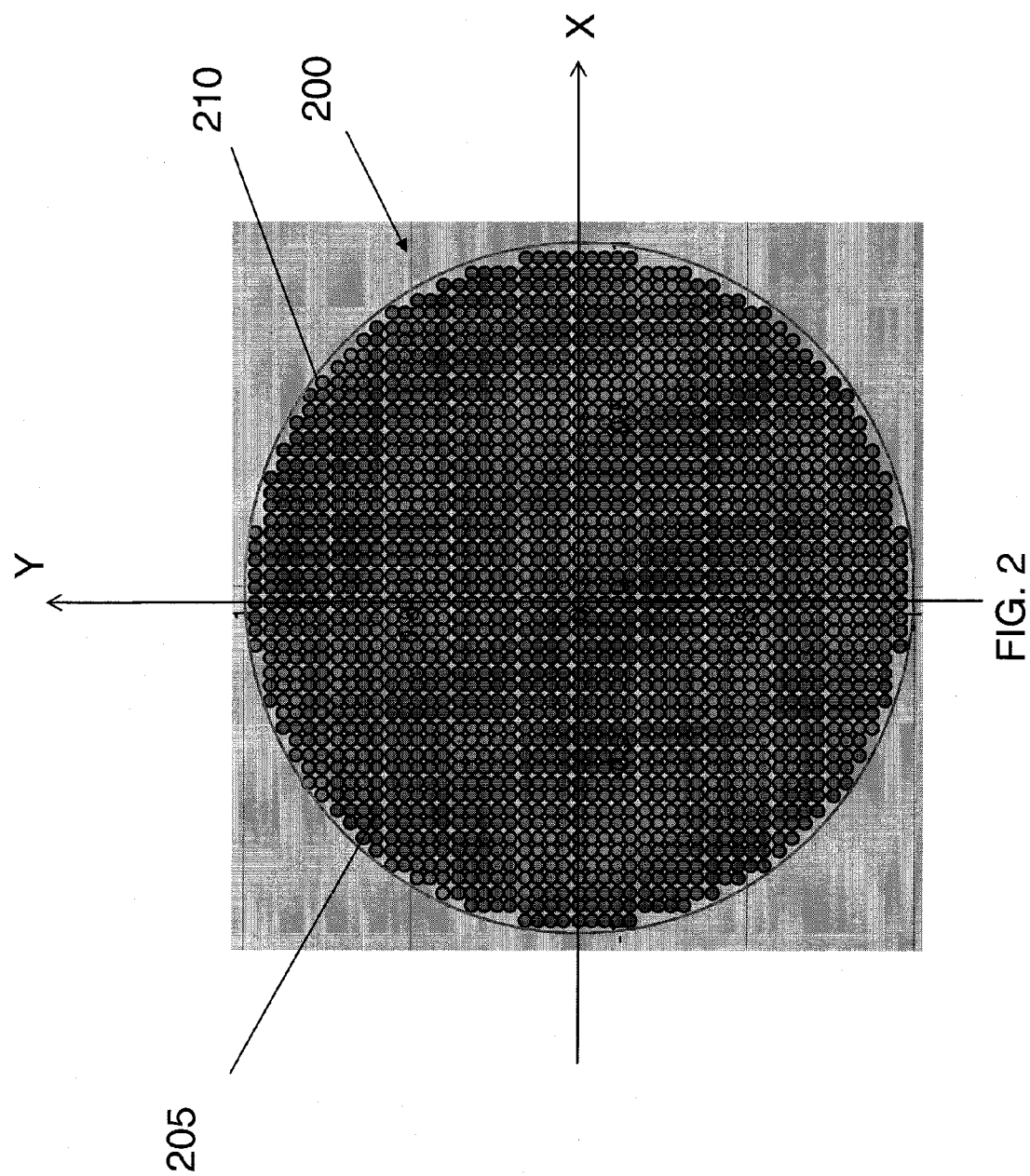
FIG. 2 is a schematic representation of a grid of illumination source points that may be used to model the illumination beam in the pupil plane of the illumination system.

FIG. 2 shows a schematic representation of a grid 200 of illumination source points 205 that may be used to model the illumination radiation beam B in the pupil plane of the illumination system IL. Illumination system IL may be a freely tunable illumination source such as the Flexray source from ASML, headquartered in Veldhoven, the Netherlands. The grid 200 is centered on the optical axis of the lithographic apparatus. In FIG. 2, this optical axis is parallel to the Z axis. Decomposition of the illumination source into a plurality of individual source points is used in Abbe imaging to calculate the image of a pattern onto the substrate. Under Abbe's formulation, the intensity on the substrate of an image of the patterning device (e.g., mask) is calculated by dividing the illumination source into a number of individual source points. Each individual illumination source point that is part of the illumination beam illuminates the patterning device. The total intensity on the substrate is calculated by summing the intensity resulting from each individual source point.

The illumination source points 205 form a grid that spatially covers the entire cross-section of a maximum clear aperture 210 in the pupil plane of the illumination system IL. The maximum clear aperture 210 in the pupil plane of the illumination system IL has a normalized radius value of $\sigma=1$. The source points 205 located inside the maximum numerical aperture will have their zero$^{th}$ diffraction order captured by the projection system PS. This situation corresponds to $\sigma \leq 1$. The physical location of each source point 305 relative to the full illuminator aperture may be varied depending on the degree of accuracy desired. For example, the grid spacing may be approximately 0.01. In the embodiment represented in FIG. 2, the grid 200 is constructed with a 51*51 square source point grid. Thus, in this implementation, the normalized diameter of the grid 200 includes 51 illumination source points. It will be appreciated that the number of illumination source points may vary in other embodiments of the illumination.

Grid 200 may be divided into a plurality of division, or pixel groups, that include one or more illumination source points 205. Each pixel group is defined by its polar coordinates ($\sigma r$, $\theta$). For each pixel group, radius $\sigma r$ defines the distance from the center of the grid 200, which corresponds to the optical axis of the lithographic system, to the center of the pixel group. Angle $\theta$ corresponds to the angular position of the pixel group relative to the X axis. In FIG. 2, the X axis is substantially parallel to one of the main directions of the patterns that are being imaged. For example, the X axis may be parallel to the vertical or horizontal direction of the patterns. It will be appreciated that the orientation of the X axis may be different in other embodiments of the invention.

The total number of pixel groups may vary depending on the geometry of the pattern(s) that is/are being considered in the configuration or illumination process. In one implementation, two different symmetry classes may be considered to define the total number of pixel groups. For example, for simple pattern(s) with C4 symmetry, fewer pixel groups may be needed to perform the illumination configuration or optimization because the groups also have C4 symmetry and more pixels in each group than groups with lower symmetry. An example of such a pattern includes a pattern of horizontal and vertical lines or a square array of holes. These patterns are not changed by a 90° rotation. Therefore, the illuminator or illumination system will be symmetric about the X and Y axes and the diagonals. In this configuration, a pixel group in one octant can be symmetrically reproduced in the other octants during the configuration of the illumination conditions. Alternatively, for pattern(s) with lower symmetry, it may be desirable to use additional pixel groups to perform the illumination configuration, as each group also should have lower symmetry. An example of a pattern including two planes of symmetry is a pattern of vertical lines, horizontal lines or brickwall. A single V-line, brickwall, rectangular hole grid and chevron pattern have lower symmetry and a pixel group in one octant can be reflected in the X and Y axes but not the diagonals.

Figure 3:
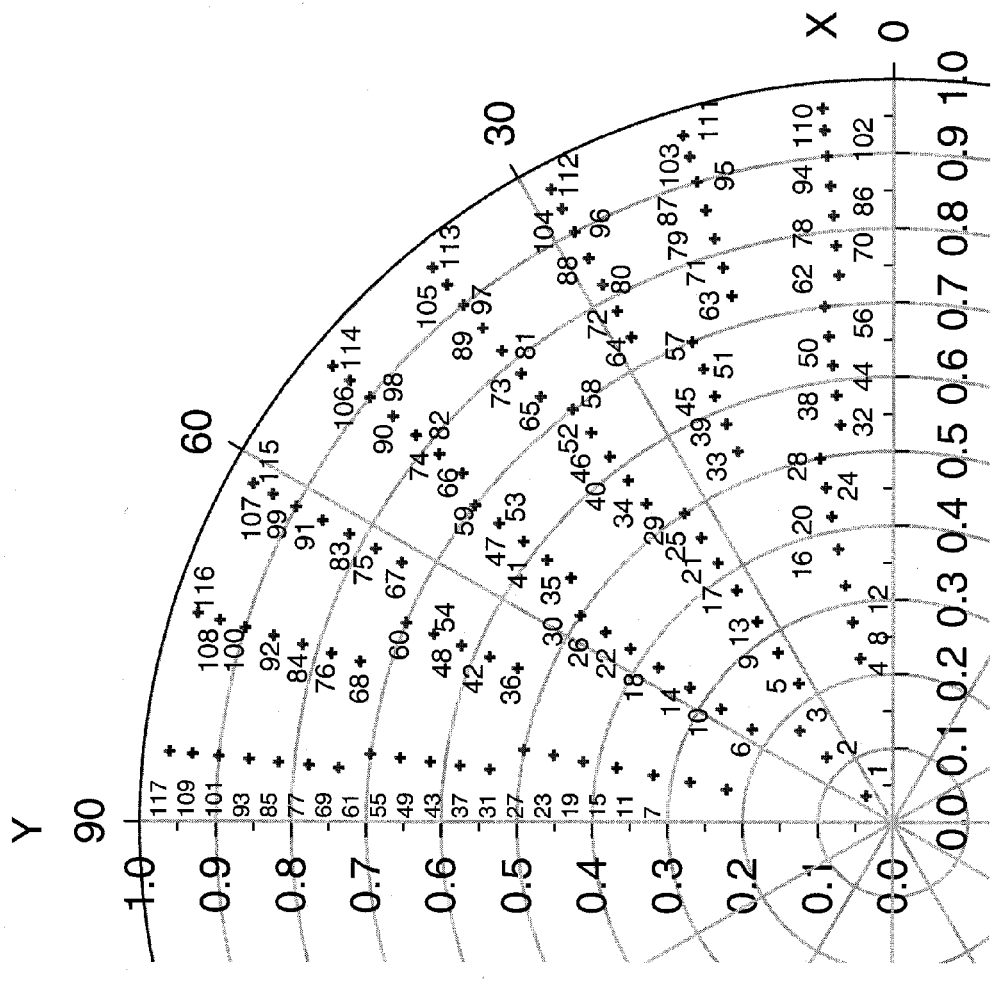
FIG. 3 shows the spatial position of each pixel group in a quadrant of the grid shown in FIG. 2.

Referring to FIG. 3, this figure shows the spatial position of each pixel group in the upper right quadrant of grid 200 in accordance with at least one embodiment of the invention. This quadrant includes 117 pixel groups. The positions of the pixel groups in the remaining quadrants of the grid 200 can be obtained by symmetry with respect to the X and Y axes. The map assignment for the pixel groups of FIG. 3 corresponds to a two symmetry plane configuration. In this configuration, each pixel group is symmetrically mapped with respect to the X and Y axes. As each pixel group may include more than one illumination source point, the radial and angular position ($\sigma r$, $\theta$) of each pixel group includes a maximum and a minimum value. In another configuration, each pixel group is symmetrically mapped with respect to the X and Y axes and the diagonal of the quadrant. In other approaches, pixel groups may be defined with Cartesian representations.

According to one embodiment, a pixel group may be in one of at least two states: on and off. When a pixel group is in the "on" state, the illumination points within the pixel group are illuminated and the pixel group is part of the illumination source's illumination shape. When a pixel group is in the "off" state, the illumination points within the pixel group are not illuminated and the pixel group is not part of the illumination source's illumination shape. In another embodiment, each pixel group may be illuminated at a different level of intensity. This is also known as grayscale tuning. In grayscale tuning, the states of a pixel group may vary from, fro example 0 (0% intensity), to 0.5 (50% intensity), to 1 (100% intensity). A pixel group may also be illuminated at an intensity exceeding 100% (e.g., 200% when the state of the pixel group is 2).

Figure 4B:
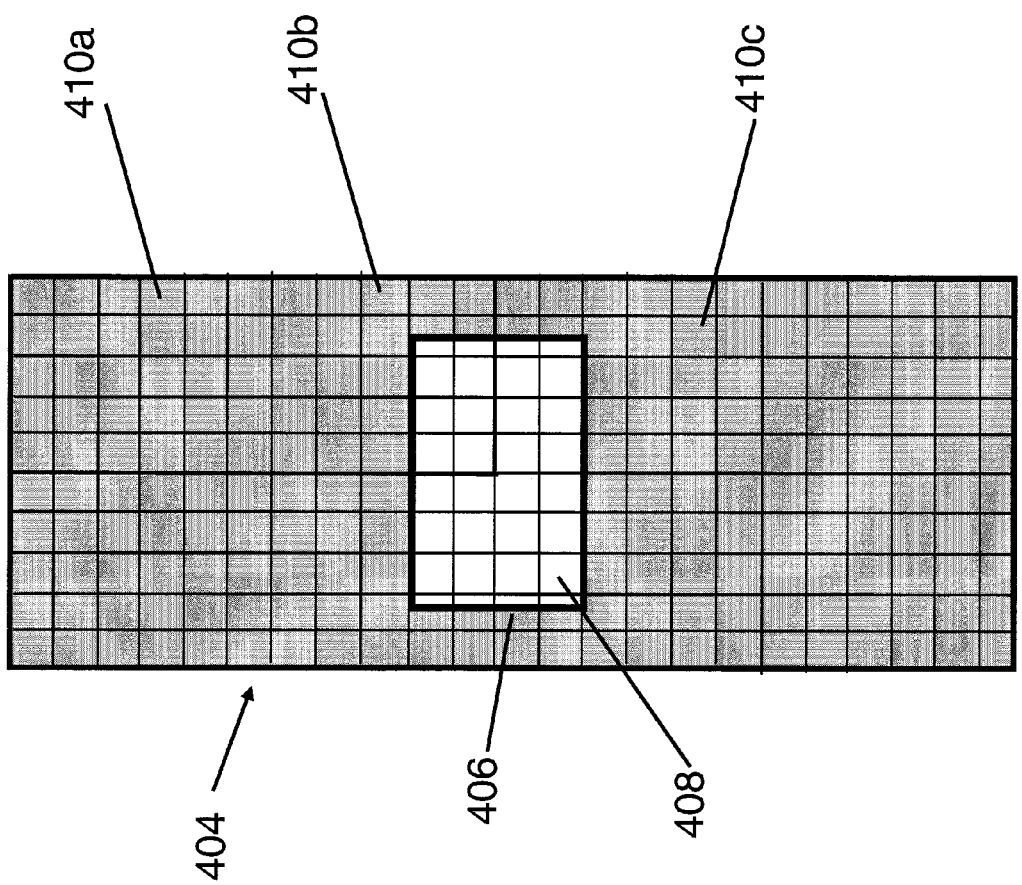
FIG. 4B is a schematic representation of an unit cell in a mask, the unit cell containing mask tiles.

FIG. 4A depicts an example hole mask pattern 402 for a mask. The hole pattern 402 may be divided into unit cells, such as unit cell 404. FIG. 4B is a more detailed depiction of unit cell 404, which includes main feature 406. Main feature 406 is represented by one or more bias able continuous polygons, usually rectangles, such as rectangle 408. Continuous polygons may be continuously adjusted in size in an OPC process. In addition, unit cell 404 includes mask tiles such as mask tiles 410a, 410b, and 410c. Mask tiles 410a, 410b, and 410c may be used to define adjustable serifs and/or assist features. The size of a mask tile need not be uniform and may be of a variety of sizes. In FIG. 4C, a unit cell 412 containing mask tiles of two different sizes is depicted. Coarse mask tiles (e.g., mask tiles 416a and 416c) may be 24 nm×24 nm. Fine mask tiles (e.g., mask tile 416b) may be 12 nm×12 nm. As depicted, the sizes of mask tiles are uniform within each of three regions 414a, 414b, and 414c in unit cell 412.

In a chromeless mask, the state of a mask tile may be zero-transmission or one-transmission with zero phase shift. In a chromeless phase-shift mask, the state of a mask tile may be zero-transmission or one-transmission with a 180-degree phase shift. In an attenuated phase shift mask (Att-PSM), the state of a mask tile may be one-transmission or X-transmission with a 180-degree phase shift, where X may be a variety of percentage values. Typically, X is 6%.

The total number of mask tiles that are considered may vary depending on the geometry of the pattern of mask tiles that is being considered for the unit cell. In the unit cell 412 of FIG. 4C, for example, there are a total 112 coarse mask tiles, but this may be reduced through symmetry to 42 unique coarse mask tiles. Similarly, the 208 fine mask tiles in unit cell 412 may be reduced to 52 unique fine mask tiles by symmetry. The total number of unique mask tiles in unit cell 412 is the sum of 42 and 52, or 94.

In an example embodiment based on FIGS. 3 and 4C, the total number of divisions to be considered is 117 pixel groups of the illumination source and 94 mask tiles of the mask, or a total of 211 divisions.

A goal is to determine a good source and mask configuration for printing a desired pattern. Given a set of discrete divisions, such as the 117 illumination source pixel groups and the 94 mask tiles, accomplishing this goal amounts to finding an optimal set of states for the discrete divisions.

Figure 5:
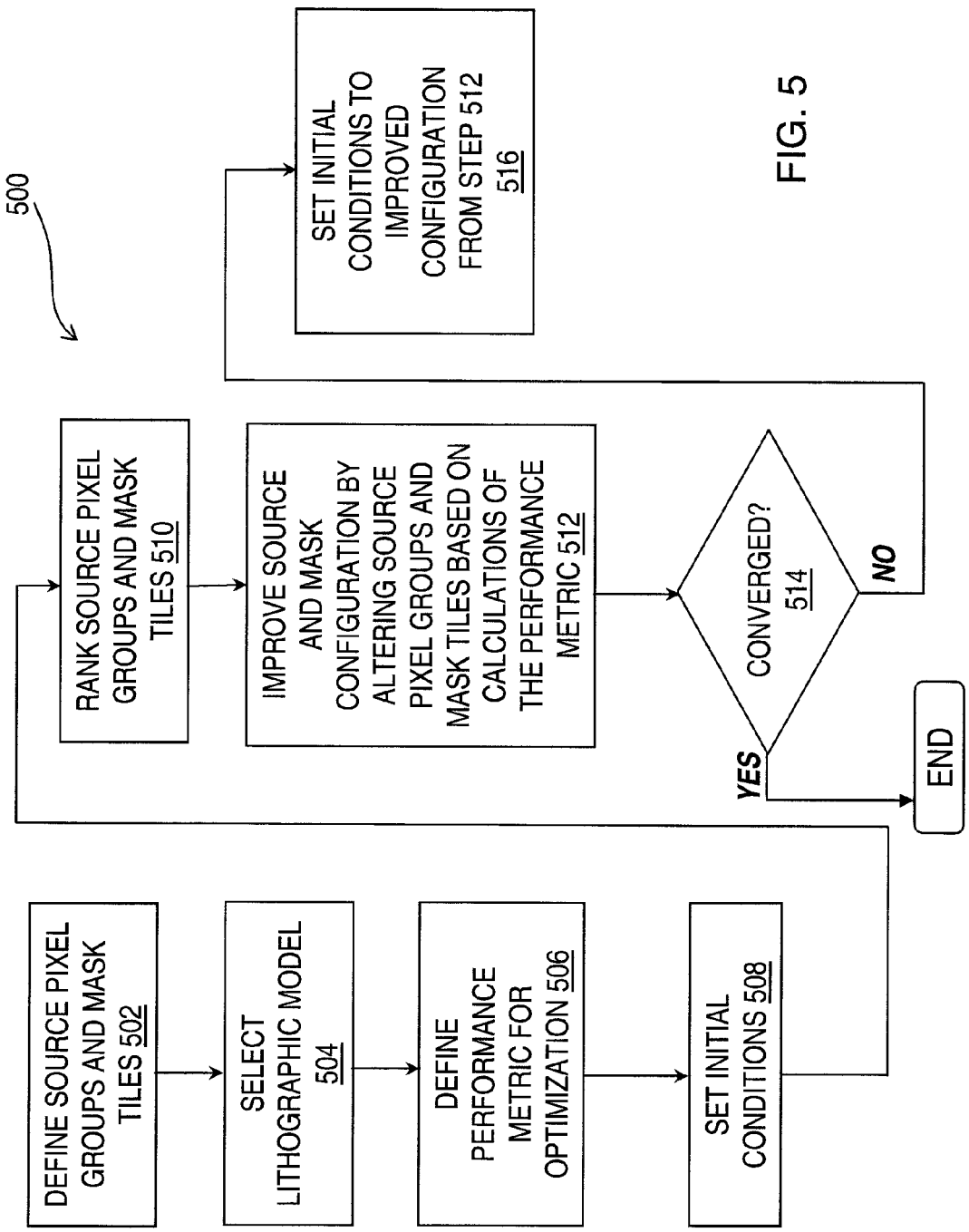
FIG. 5 shows an exemplary flowchart for configuring an illumination source and a mask in accordance with an embodiment of the invention.

FIG. 5 shows an exemplary flowchart 500 for configuring an illumination source and a mask in accordance with an embodiment of the invention. The method starts by defining the pixel groups of the illumination source and the mask tiles of the mask (step 502). Generally, a pixel group or a mask tile may also be referred to as a division of a lithographic process component. In one exemplary approach, the illumination source is divided into 117 pixel groups, and 94 mask tiles are defined for the mask, substantially as described above, resulting in a total of 211 divisions.

In step 504, a lithographic model is selected as the basis for photolithographic simulation. Photolithographic simulations produce results that are used in calculations of photolithographic metrics, or responses. A particular photolithographic metric is defined to be the performance metric that is to be optimized (step 506). In step 508, the initial (pre-optimization) conditions for the illumination source and the mask are set up. Initial conditions include initial states for the pixel groups of the illumination source and the mask tiles of the mask such that references may be made to an initial illumination shape and an initial mask pattern. Initial conditions may also include mask bias, NA, and focus ramp range. Although steps 502, 504, 506, and 508 are depicted as sequential steps in flowchart 500, it will be appreciated that in other embodiments of the invention, these steps may be performed in other sequences. Further details regarding steps 504, 506, and 508 are provided in the sections below.

In step 510, the pixel groups and mask tiles are ranked. Pixel groups and mask tiles may be interleaved in the ranking. Various ways of ranking may be employed, including: sequentially (e.g., from pixel group 1 to pixel group 117 and from mask tile 1 to mask tile 94), randomly, according to the physical locations of the pixel groups and mask tiles (e.g., ranking pixel groups closer to the center of the illumination source higher), and according to how an alteration of the pixel group or mask tile affects the performance metric. Further details regarding the ranking of pixel groups and mask tiles according to how alterations affects the performance metric are provided in the sections below.

Once the pixel groups and mask tiles are ranked, the illumination source and mask are adjusted to improve the performance metric (step 512). In step 512, each of the pixel groups and mask tiles are analyzed, in order of ranking, to determine whether an alteration of the pixel group or mask tile will result in an improved performance metric. If it is determined that the performance metric will be improved, then the pixel group or mask tile is accordingly altered, and the resulting improved performance metric and modified illumination shape or modified mask pattern form the baseline for comparison for subsequent analyses of lower-ranked pixel groups and mask tiles. In other words, alterations that improve the performance metric are retained. As alterations to the states of pixel groups and mask tiles are made and retained, the initial illumination shape and initial mask pattern changes accordingly, so that a modified illumination shape and a modified mask pattern result from the optimization process in step 512.

In other approaches, mask polygon shape adjustments and pairwise polling of pixel groups and/or mask tiles are also performed within the optimization process of 512. These techniques and other details regarding step 512 are provided in the sections below.

In step 514, a determination is made as to whether the performance metric has converged. The performance metric may be considered to have converged, for example, if little or no improvement to the performance metric has been witnessed in the last several iterations of steps 510 and 512. If the performance metric has not converged, then the steps of 510 and 512 are repeated in the next iteration, where the modified illumination shape and modified mask from the current iteration are used as the initial illumination shape and initial mask for the next iteration (step 516).

The various detailed aspects of the method illustrated by flowchart 500 are now discussed.

Details regarding the definition of source pixel groups and mask tiles (step 502) have already been discussed above with regards to FIGS. 2, 3, and 4.

In step 504, a lithographic model is selected as the basis for photolithographic simulations. The selected lithographic model may be an aerial image model or a resist model. A resist model takes into account the deviation from the projected aerial image caused by diffusion processes and finite dissolution contrast. The resist model may also take into account the non-planar topography at the surface of the substrate and the vector effects. The vector effects refer to the fact that an electromagnetic wave propagates obliquely when a high numerical aperture is used. An image-in-film model may also be used. Alternatively, a lumped parameter model or a variable threshold resist model may also be used in at least one embodiment of the invention to calculate the photolithographic metric or response. A calibrated model is a model that has been matched to experimental data. Preferably, the photolithographic simulations are done using a calibrated resist model or a calibrated lumped parameter model (LPM).

In another implementation, an aerial image model may be used to calculate the photolithographic metric or response. Calculation of the aerial image may be done either in the scalar or vector form of the Fourier optics. The quality of the aerial image may be determined by using image contrast or the normalized image log-slope (NILS) metric (normalized to the feature size). For typical high NA cases, these image metrics inside the resist film may be determined.

Additional information regarding the calculations of an image of a patterning device (e.g., mask) pattern using photolithographic simulations may be gleaned, for example, in U.S. Pat. No. 6,839,125 issued on Jan. 4, 2005, entitled "Method for Optimizing an Illumination Source Using Full Resist Simulation and Process Window Metric" and U.S. Pat. No. 7,016,017, issued on Mar. 21, 2006, entitled "Lithographic Apparatus and Method for Optimizing an Illumination Source Using Isofocal Compensation." The contents of these two applications are incorporated herein in their entirety by reference.

In step 506, a photolithographic metric is defined to be the performance metric that is to be optimized. The performance metric used in the optimization process in flowchart 500 is a value function that is selected to estimate and/or gauge the combined performance of an illumination shape and mask to print a lithographic pattern. More generally, the performance metric may also be termed a lithographic response. The performance metric may be, for example, a critical dimension uniformity (CDU) of the printed pattern, a dimension of the process window, mask error enhancement factor (MEEF), a depth of focus (DOF), maximum NILS, maximum NILS in defocus, edge placement error, process variation bandwidth, a worst deviation in a process corner, or a combination of any of the above. A CDU indicates a critical dimension variation that results from variations resulting from a particular process error. The performance metric may comprise multiple CDUs, each CDU reflecting a variation from a different process error. The performance metric is a user-defined complex metric, and the user may choose the performance metric to be a combination of any of the above-mentioned metrics, including multiple CDUs. The user may also choose and customize individual weights given to any metric and/or CDU that comprise the overall performance metric. In this manner, the performance metric is a flexible metric that may be customized to suit each user's needs and objectives in performing source-mask optimization. In one example, the performance metric may comprise of an overall CDU that is itself a combination of several individual CDUs:

$$\text{performance metric} = 0.5 * [CD_{range}(\text{focus})^2 + CD_{range}(\text{dose})^2 + CD_{range}(\text{mask})^2]^{0.5}$$

Figure 6:
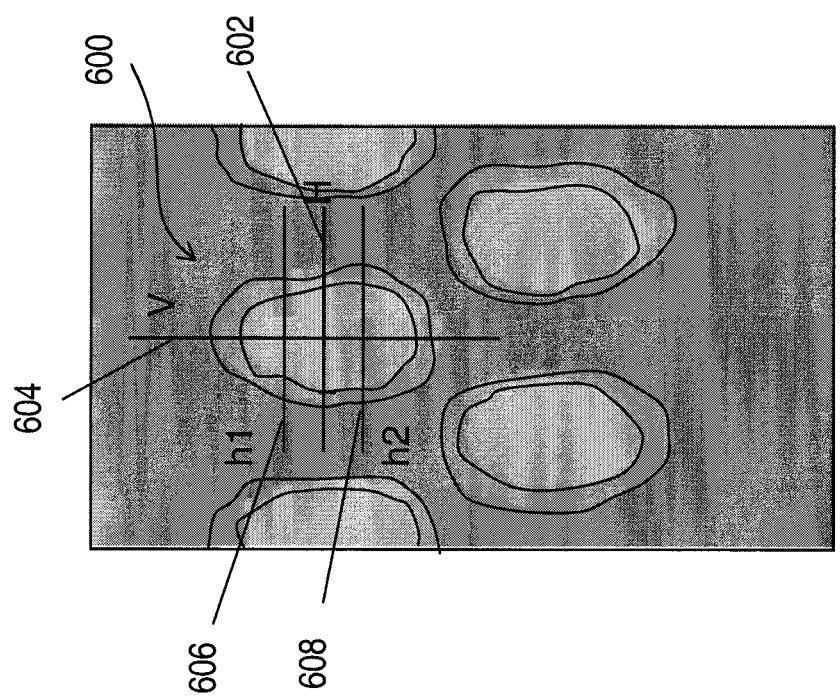
FIG. 6 shows an image of a contact feature.

In addition, a user can also define the performance metric to include pattern fidelity metrics. Pattern fidelity metrics account for how closely a printed mask pattern adheres to desired patterns, a characteristic that is typically not well indicated by the CDU-centric metrics mentioned above. FIG. 6 illustrates a specific example of using a pattern fidelitymetric. FIG. 6 depicts contact 600, which is a NAND twisted bit-line contact that is ideally rectangular in shape. A performance metric for printing contact 600 may be defined to be:

$$\text{performance metric} = \text{CDU-centric metric} + \text{pattern fidelity metric}$$

where CDU metric is the average of (1) the CDU of H cut 602 and V cut 604 of contact 600 and (2) the CDU of the worst cut of contact 600. The CDU of a cut may be defined similar to the performance metric above:

$$CDU = 0.5 * [CD_{range}(\text{focus})^2 + CD_{range}(\text{dose})^2 + CD_{range}(\text{mask})^2]^{0.5}$$

for assumed focus, dose, and mask critical dimension ranges.

The pattern fidelity metric focuses on how closely contact 600 resembles the desired rectangular shape. To assess this, two more cuts, h1 cut 606 and h2 cut 608, are defined. Ideally, h1 cut 606 and h2 cut 608 are the same size as H cut 602. Also, h1 cut 606 and h2 cut 608 should also be symmetric. That is, h1 cut 606 should be equal to h2 cut 608. Accordingly, a pattern fidelity metric may be defined to be:

$$\text{pattern fidelity metric} = |(h1-t)/8| + |(h2-t)/8| + |(h1-h2)/2| + \max(SLD)$$

where h1 and h2 are the lengths of the h1 cut 606 and h2 cut 608 in FIG. 6, respectively, and t is a user-defined target (e.g., t may be equal to the size of H cut 602). SLD is the sidelobe printing depth. SLD also accounts for any printing of assist features (AFs). It should be noted that the weights used in the pattern metric (e.g., ⅛, ⅛, and ½) are exemplary values and may be defined differently by different users. In this case, for example, the symmetry of h1 cut 606 and h2 cut 608 is given more weight than the closeness of h1 cut 606 and h2 cut 608 to the ideal size t, but a different user may define this in a different manner. It should also be apparent to a person skilled in the art that a user may also, for the overall performance metric, give varying weights to CDU-centric metrics and pattern fidelity metrics.

Figure 7:
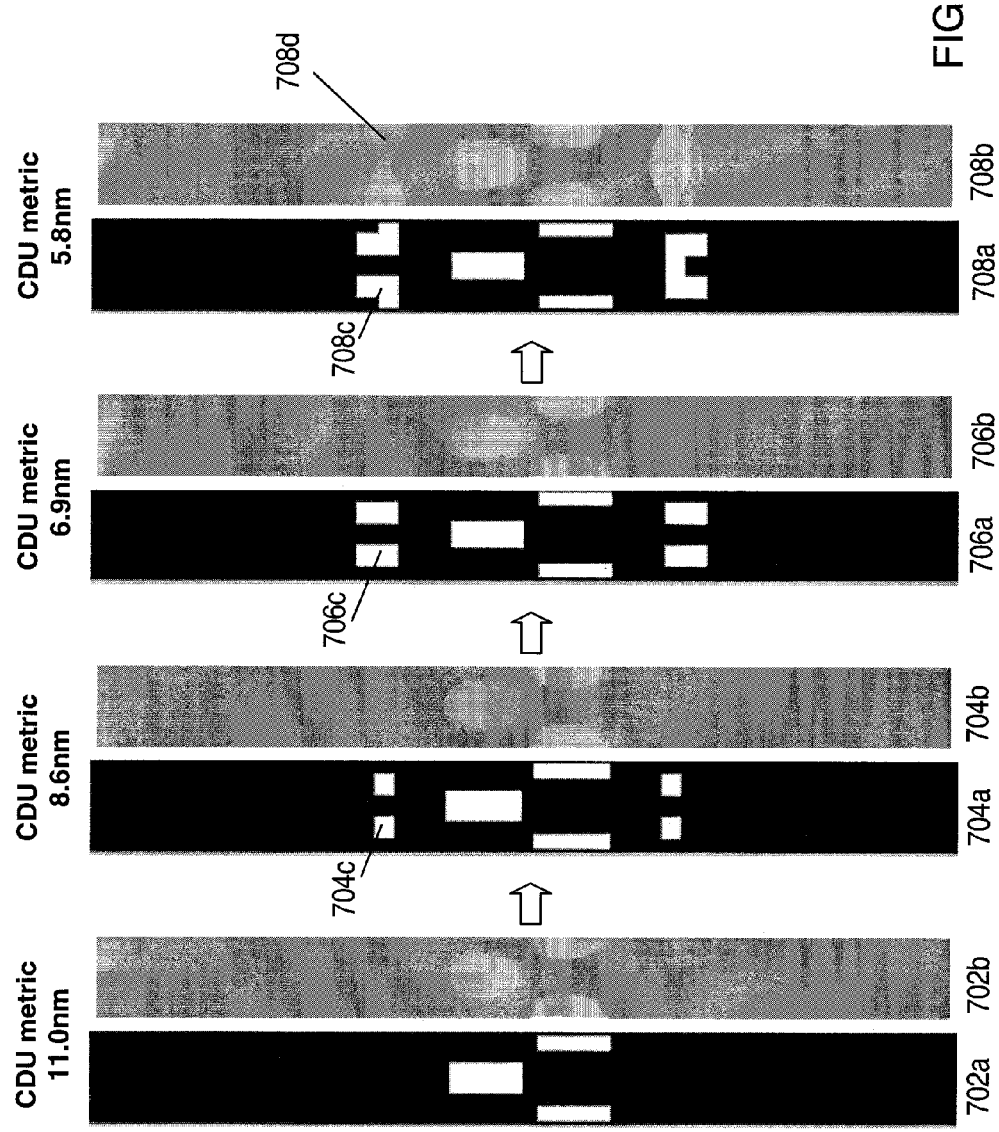
FIG. 7 shows a series of mask lithography patterns and corresponding simulated images.

FIG. 7 illustrates an example of how a complex lithography metric that includes a pattern fidelity metric is used to derive an optimal lithography pattern. FIG. 7 depicts successive lithography patterns resulting from the optimization process in flowchart 200 and the corresponding simulated images from the lithography patterns. Lithography pattern 702*a* is simulated to produce image 702*b* with a particular illumination shape, such as an annular ring. In the example in FIG. 7, the same illumination source is used for all the simulations for simplicity of illustration. There are no assist features in lithography pattern 702*a*. The CDU metric for lithography pattern 702*a* is calculated to be 11.0 nm for the assumed error budget. Next, an iteration or iterations of the optimization loop in flowchart 200 results in lithography pattern 704*a*, which is simulated to produce image 704*b*. Lithography pattern 704*a* contains assist features such as assist feature 704*c*, which results from a change in state of the mask tile(s) that comprise assist feature 704*c* (e.g., from zero-transmission to one-transmission). The CDU metric for lithography pattern 704*a* is calculated to be 8.6 nm, which is an improvement over lithography pattern 702*a*'s CDU metric of 11.0 nm. Similarly, lithography pattern 706*a* is simulated to produce image 706*b* with a CDU metric of 6.9 nm, another improvement. Lithography pattern 706*a* contains assist feature 706*c*. Finally, lithography pattern 708*a* is simulated to produce image 708*b* with a CDU metric of 5.8 nm and comprises assist feature 708*c*.

Although each successive lithography pattern (from 702*a* through 708*c*) results in an improved CDU metric, lithography pattern 708*a* actually resulted in an image 708*b* that includes the printing of the assist features 708*c*. The printed assist feature 708*d* is undesirable. However, a lithographic metric based only on CDU metrics does not adequately detect such undesirable effects. According to one approach, the lithography metric used for optimization includes both a CDU metric and a pattern fidelity metric, such as the complex optimization metric discussed above, where the pattern fidelity metric accounts for printing of assist features or side lobes as well as undesirable feature shapes. In the example illustrated in FIG. 7, although lithography pattern 708*a* results in the best CDU metric, the overall optimization metric that includes pattern fidelity metrics will not show an improvement from lithography pattern 706*a* to lithography pattern 708*a* due to the printing of assist feature 708*d*. As a result, the changes in state of the mask tiles that produced lithography pattern 708*c* will be rejected.

Although the above examples are illustrated with a particular formulation for a complex metric that is based on CDU metrics, it will be appreciated that additional lithographic metrics or responses, such a dimension of the process window, mask error enhancement factor (MEEF), a depth of focus (DOF), maximum NILS or maximum NILS in defocus, edge placement error, process variation bands, or worst case CD deviation may be used in an embodiment of the invention. Those skilled in the art will understand how to adopt embodiments of the invention to utilize other metrics after being taught by the above examples.

In step 508, the initial conditions for the illumination source and mask are set up. As will be appreciated by one of ordinary skill in the art, the initial conditions may be determined via experimentation or simulation. In accordance with at least one embodiment of the invention, the initial states of the divisions of lithographic process components such as pixel groups and mask tiles are chosen such that the initial illumination shape and the initial lithography pattern provide a relatively good lithographic metric. The initial states may be determined either via experimentation or simulation, as will be appreciated by one of ordinary skill in the art. According to one approach, a grid search is performed to find a good starting condition for the optimization. Variables such as mask type (binary, Att-PSM, CPL, Alt-PSM), mask bias, NA, and parametric source shape (e.g. annular with various sigma settings) and sometimes a focus ramp range are typically considered. An annular ring location, for example, can be used to initiate the states of the pixel groups of the illumination source. Mask tiles of the mask located in the assist feature region may be initialized to be all in zero-transmission states, so that the initial lithography pattern of the mask does not include any assist features. Other initial parameters, such as mask type, mask bias, dose, NA, focus ramp range etc., do not directly affect the initial states of pixel groups or mask tiles, but do affect the metric and are useful to include in an initial discrete grid search to establish a good starting point for the optimization.

In step 510, the pixel groups and mask tiles are ranked. Pixel groups and mask tiles may be interleaved in the ranking. For example, a pixel group ranked second may be followed by a mask tiled ranked third. Various ways of ranking may be employed, including: sequentially, randomly, according to physical locations, etc. In one approach, the pixel groups and mask tiles are ranked according to how alterations of the pixel groups and mask tiles affect the performance metric. More specifically, the pixel groups and mask tiles are ranked such that a higher-ranked pixel group or mask tile is a pixel group or mask tile whose alteration, or change of state from the initial state, results in more improvement to the performance metric than a lower-ranked pixel group or mask tile. In other words, a linear sensitivity analysis is performed on the pixel groups and mask tiles with respect to the performance metric, and the pixel groups and mask tiles are ranked accordingly to the results of the linear sensitivity analysis.

In one approach for ranking the pixel groups and mask tiles, the performance metric is calculated for the initial illumination shape and the initial lithography pattern (i.e., when the pixel groups and the mask tiles are all in initial states). Then, for each pixel group and each mask tile, the performance metric is recalculated based on a change in state of the pixel group or mask tile from the initial state of that pixel group or mask tile, the states of all other pixel groups and tiles remaining in the initial states. For each pixel group and each mask tile, the recalculated performance metric is compared to the performance metric calculated for the initial illumination shape and the initial lithography pattern (hereinafter also referred to as the initial performance metric), and the change of the recalculated performance metric over the initial performance metric is determined. How an alteration of a pixel group or mask tile affects the performance metric is gathered as linear sensitivity data. Based on the changes, the pixel groups and mask tiles are ranked such that a change in state from initial state of a higher-ranked pixel group or mask tile results in a greater amount of improvement in the recalculated performance metric over the initial performance metric than a change in state from initial state of a lower-ranked pixel group or mask tile.

Once the pixel groups and mask tiles are ranked, the configurations of the illumination source and the mask are optimized through alterations of the pixel groups and mask tiles (step 512). Flowchart 800 in FIG. 8 illustrates in more detail the process performed in step 512.

Figure 8:
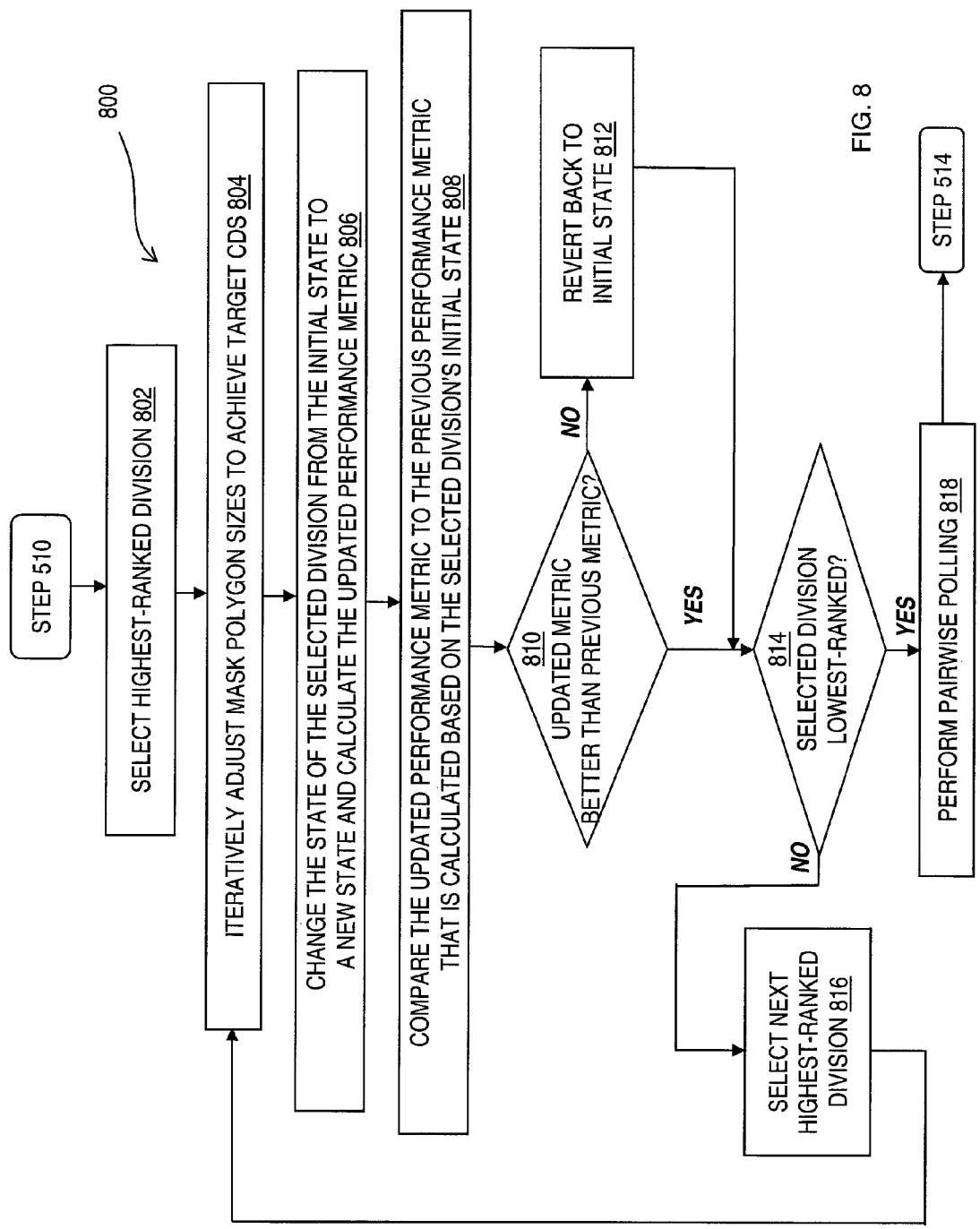
FIG. 8 shows an exemplary flowchart for optimizing a configuration of an illumination source and a mask in accordance with an embodiment of the invention.

Referring to FIG. 8, the highest-ranked division is selected (step 802). In an embodiment, a division is a source pixel group or mask tile. Next, in block 806, the state of the selected pixel group or mask tile is changed from the initial state to a new state, and an updated performance metric is calculated based on the new state. For example, if the high-ranked pixel group or mask tile is pixel group 1, and pixel group 1 is initially "off", pixel group 1 is changed to "on", and an updated performance metric is calculated based on pixel group 1 being "on". In block 808, the updated performance metric is compared to a previous performance metric, where the previous lithographic metric is calculated based on the state of the pixel group or mask tile being the initial state (i.e., before the state change). Continuing with the example, the previous lithographic metric was calculated based on the state of pixel group 1 being "off". If the updated performance metric is better than the previous performance metric (block 810), then the state of pixel group 1 retains the changed state. In other words, if changing pixel group 1 from "off" to "on" improves the performance metric, then pixel group 1's state change is retained. Otherwise, the state of pixel group 1 is reverted back to the initial state (812).

It will be appreciated that although the above example discusses a state of a pixel group being either "on" or "off", the state of a pixel group may, in other embodiments, be any state available in a grayscale tuning scheme (e.g., 0.1, 0.5, 2.0, etc.). Also, although the above example discusses an alteration to a pixel group, an alteration to a mask tile may similarly be analyzed.

Additionally and optionally, the adjustment of mask polygon sizes to achieve target CDs may be performed within the optimization process outlined in flowchart 800. In one approach, mask polygon sizes are iteratively adjusted before the change of state and calculation of the updated performance metric in block 806 (i.e., in block 804). In this approach, the calculation of block 806 is performed based on a simulation of a mask pattern that has been modified by the mask polygon adjustments made in block 804. In block 804, the CDs are iteratively measured and the mask's main feature dimensions and locations are adjusted based on simulation results. The mask polygon adjustment process may be deemed to have converged where the maximum CD error is no larger than a pre-selected value, for example 0.2 nm. It should be apparent to persons skilled in the art that adjustments of mask polygon sizes are applied to the main features of a mask pattern (e.g., main feature 406 in FIG. 4B) and may be made separately and independently from mask tile state changes. It should also be appreciated that additional techniques such as assist feature or serif placement may be used in block 804, in an embodiment of the invention.

Modifications to the mask pattern are retained as a starting point for the next iteration of the optimization loop in flowchart 800. In this manner, mask polygon modifications are performed along with the process of finding optimal states for pixel groups and mask tiles and an accurate calculation for the evaluation metric is obtained.

Next, a check is performed to see if the selected pixel group or mask tile is the lowest-ranked division (block 814). Continuing with the example, a check is performed to see whether pixel group 1 is the lowest-ranked pixel group or mask tile. Since pixel group 1 is the highest-ranked pixel group or mask tile overall, pixel group 1 is not the lowest-ranked pixel group or mask tile, and step 816 is performed in which the next highest-ranked pixel group or mask tile is selected. For example, the next highest-ranked pixel group or mask tile may be mask tile 211. The steps of 806, 808, 810, possibly 812, optionally 804, and 814 are then repeated for mask tile 211. For example, if mask tile 211 is initially in a zero-transmission state, and if changing mask tile 211 to a one-transmission state improves the lithographic metric, then mask tile 211 will be changed to a one-transmission state after steps 206, 208, 210, and 212 are performed for mask tile 211. It should be noted that once a pixel group or mask tile is altered, the altered state of the pixel group or mask tile will be the basis upon which performance metrics in later iterations are calculated. In this manner, pixel groups and mask tiles are evaluated based upon whether changes to the states of pixel groups and mask tiles improve upon performance metrics that already account for previously retained changes of states, and only changes of states that improve the performance metric are retained. In other words, only beneficial alterations are retained.

After all the pixel groups and mask tiles have been evaluated (e.g., the answer to the decision in block 814 is "No"), and the source and mask configurations improved, the optimization process may proceed to step 514 in flowchart 500 in FIG. 5. At this point, the retained changes to the states of the pixel groups and mask tiles result in a modified illumination shape for the illumination source and a modified lithography pattern for the mask.

Additionally and optionally, pairwise polling may be performed to test whether the illumination shape and/or mask pattern can be further optimized (block 818). During pairwise polling, an updated performance metric is calculated based on the states of two divisions changing simultaneously. The updated performance metric is compared to a previous performance metric that is calculated based on the unchanged states of the two divisions and, if the updated lithographic metric shows an improvement over the previous lithographic metric, the states of the two divisions are changed accordingly. This process may be repeated iteratively for all possible pairings of the divisions that are being optimized.

In one approach, only divisions that belong to the same lithographic process component (e.g., the pixel groups of an illumination source) are evaluated through pairwise polling. In addition, only the pixel groups of a particular state (e.g., pixel groups that are "on") may be evaluated through pairwise polling. In this manner, the number of divisions that are evaluated through pairwise polling may be reduced.

It will be appreciated that additional optimizations, such as the pairwise polling approach just described, may be performed after the optimization process in flowchart 800 has been performed.

In step 514, a determination is made as to whether the performance metric has converged (i.e. when no more improvements may be achieved through the optimization process outlined in flowcharts 500 and 800). If yes, then the optimization process terminates. If no, the steps of 510 and 512 are repeated, with the optimized configuration resulting from the current iteration being used as the initial configuration for the next iteration (step 516). Iterations of steps 510, 512, and 516 may be repeated for any number of times.

In one approach, pairwise polling and other additional optimizations are not performed within step 512, but after step 514, when it has been determined that a performance metric has converged. A determination of convergence in step 514 indicates that at least a local minimum has been achieved for the performance metric. There may be, however, other configurations that are better than the local minimum, and the performance of pairwise polling after a determination of convergence in step 514 serves to change a configuration of the source and mask in a manner that has not been tested, thereby "exciting" the configuration into a different set of testing conditions and helping to finding a global minimum for the performance metric. Iterations of steps 510, 512, and 516 may also be repeated after pairwise polling is performed.

In accordance with at least one embodiment of the invention, adjustments are made to the illumination source to achieve particular goals. Specifically, adjustments may be made to compensate for existing and known problems in a lithographic apparatus or process. For example, an illumination source may be adjusted to result in a CD for one lithographic apparatus that matches the CD of another lithographic apparatus. In another example, if a problem has been identified as contributing to a low yield, that problem may be compensated for by adjusting the illumination source. In yet another example, adjustments to the illumination source can be made to compensate for errors in mask making. In yet another example, adjustments to the illumination source can support the experimental optimization of a process. Freely tunable illumination sources, such as the Flexray source available from ASML, may be adjusted accordingly to compensate for known CD problems.

Figure 9:
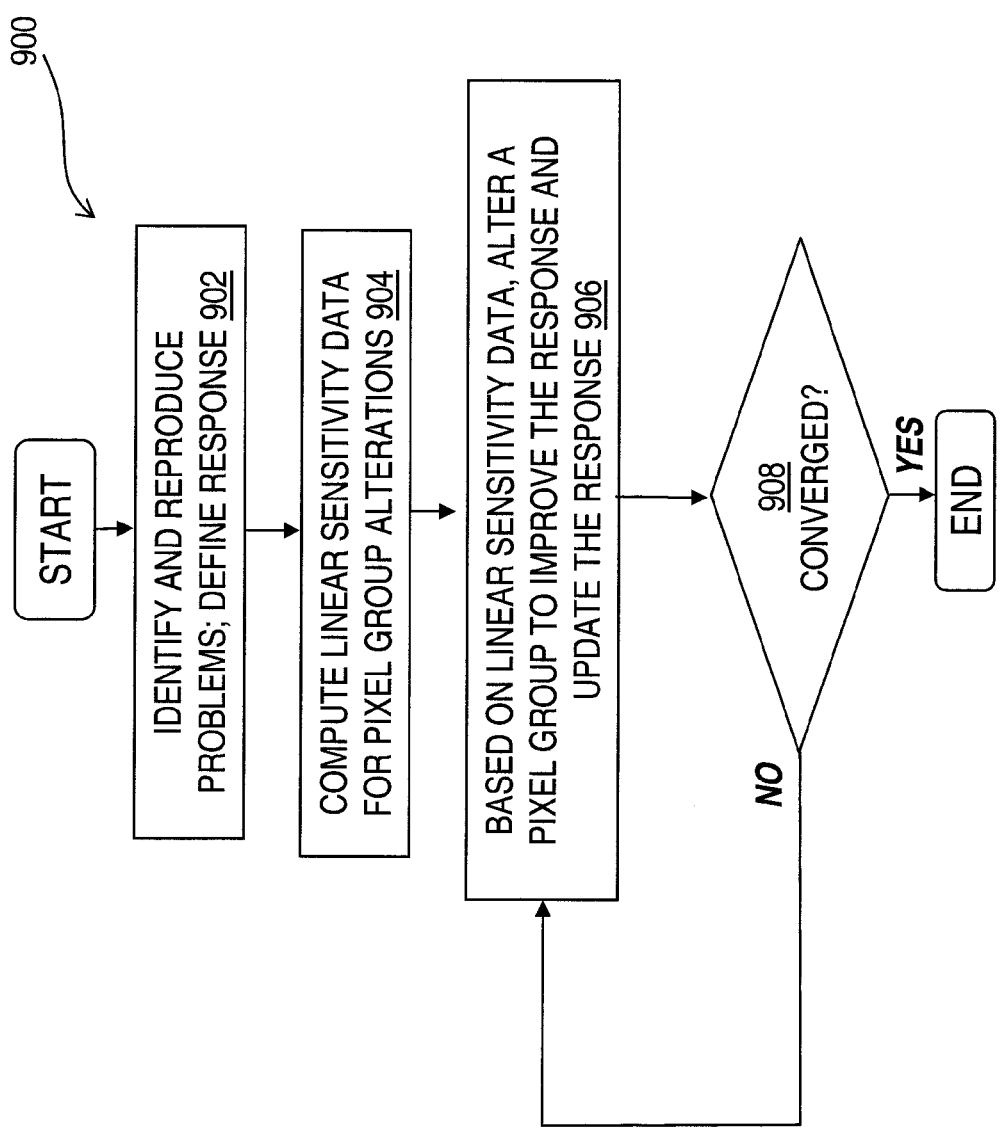
FIG. 9 shows an exemplary flowchart for adjusting an illumination source in accordance with an embodiment of the invention.

FIG. 9 illustrates flowchart 900 that depicts an exemplary process through which adjustments can be made to an illumination source to achieve particular goals. In step 902, a problem is identified and reproduced in simulation. Problems typically comprises CD errors; that is, the CDs on a printed wafer do not match target CD values. Also in step 902, a lithographic metric, or response, that will be used to evaluate any improvements to the problem is defined. In an example, a laser bandwidth variation resulted in the CD of the trench in a mask pattern, initially 45 nm, to vary from 39 nm to 51 nm. After reproducing the problem (i.e., trench CD variation due to laser bandwidth variation) in simulation, the trench CD is defined to be the evaluation response. According to one embodiment, the process of flowchart 900 also takes into account other lithographic responses and ensures that improvement to the evaluation response do not adversely affect the other lithographic responses.

Next, in step 904, the evaluation response is calculated for the initial, unadjusted illumination shape. Then, for each pixel group, the evaluation response is recalculated based on a change in state of the pixel group from the initial state of that pixel group, the states of all other pixel groups remaining in the initial states. For each pixel group, the recalculated evaluation response is compared to the evaluation response calculated for the initial illumination shape, and the change of the recalculated evaluation response over the initial evaluation response is determined. How an alteration of a pixel group affects the evaluation response is gathered as linear sensitivity data. It should be noted again that an alteration to a pixel group may include turning the pixel group on or off, as well as adjusting the intensity of the pixel group in small increments (e.g., grayscale adjustments).

An updated response of an adjusted illumination shape, the adjusted illumination shape resulting from an alteration to one or more pixel groups of the illumination shape, can be approximated by:

$$\text{updated response} = \text{initial response} + \Sigma c_i S_i$$

where the initial response is the response of the unadjusted illumination shape (e.g., initial trench CD), $c_i$ is the step size for the ith source pixel group, and $S_i$ is the linear sensitivity response of the ith source pixel group.

In step 906, an alteration that results in the most improvement to the current response is determined based on the linear sensitivity data gathered in step 904. The alteration consists of altering a particular pixel group by a particular step size (e.g., increasing the intensity of the 96th pixel group by 0.2). The alteration determined to improve the current response the most is made and an updated response is calculated based on the equation above. Step 906 may be repeated iteratively until the updated response has converged (step 908), or when no more improvement to the updated response results. In later iterations, the alteration immediately preceding the current iteration is retained, but older previous alterations may be reversed.

An example illustrating how adjustments made to the illumination shape of an illumination source can compensate for CD errors will now be discussed with respect to FIGS. 10A, 10B, 10C, and 10D.

Figure 10A:
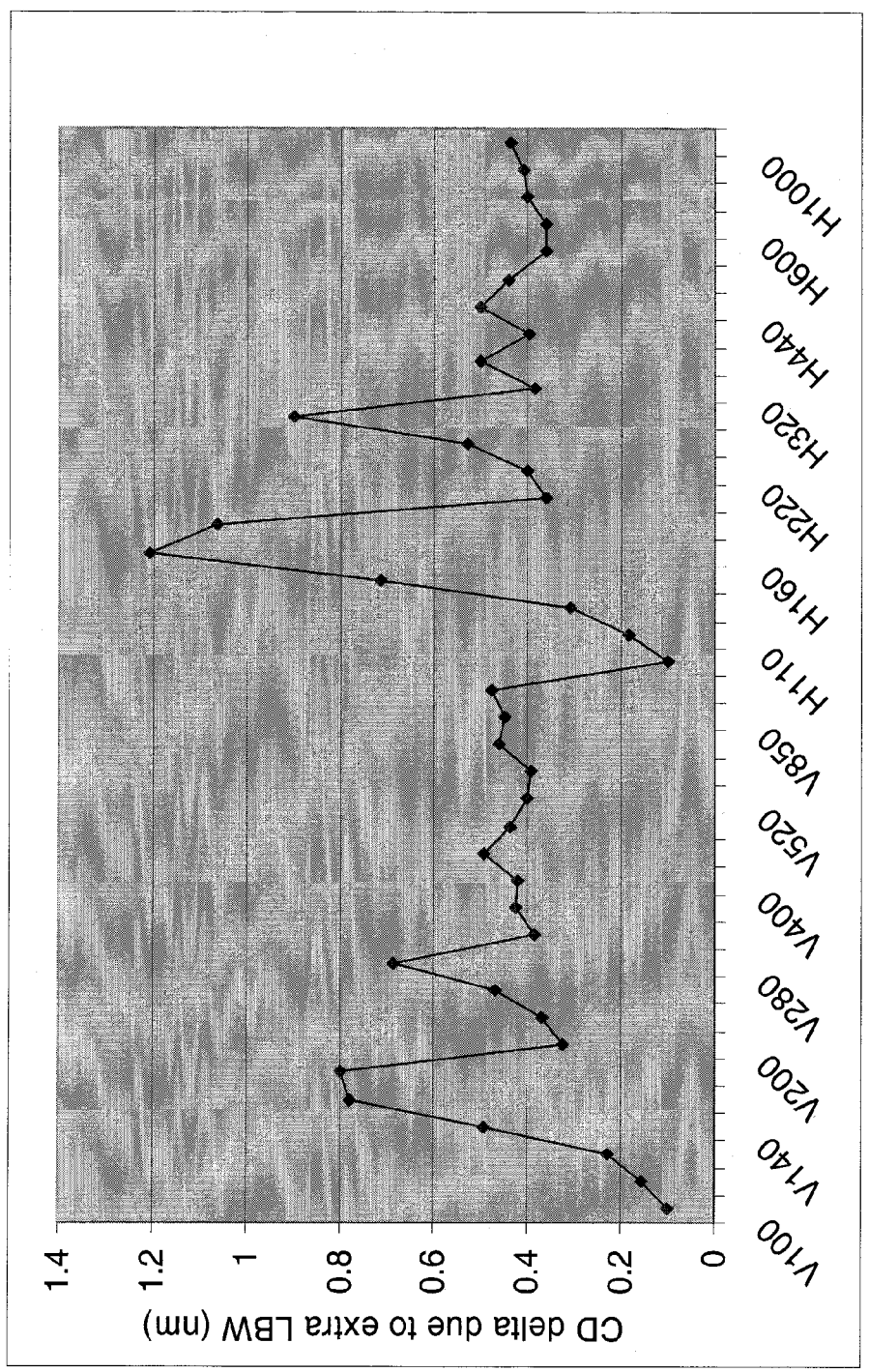
FIG. 10A through 10D shows an example of utilizing illumination source adjustments to correct CD errors, in accordance with an embodiment of the invention.

FIG. 10A depicts a chart that illustrates the CD errors for a variety of feature cuts (e.g., V100, V140, H160, etc.) as a result of a variation of a lithography process parameter. All of the features are 50 nm lines where, for example, the notation "V100" indicates a line with a vertical orientation and a 100 nm pitch and the notation "H160" indicates a line with a horizontal orientation and a 160 nm pitch. More specifically, the chart in FIG. 10A indicates that the CD errors resulting from a variation of 0.1 picometer (from 0.2 picometer to 0.3 picometer) of the laser bandwidth employed in the lithographic process.

Figure 10B:
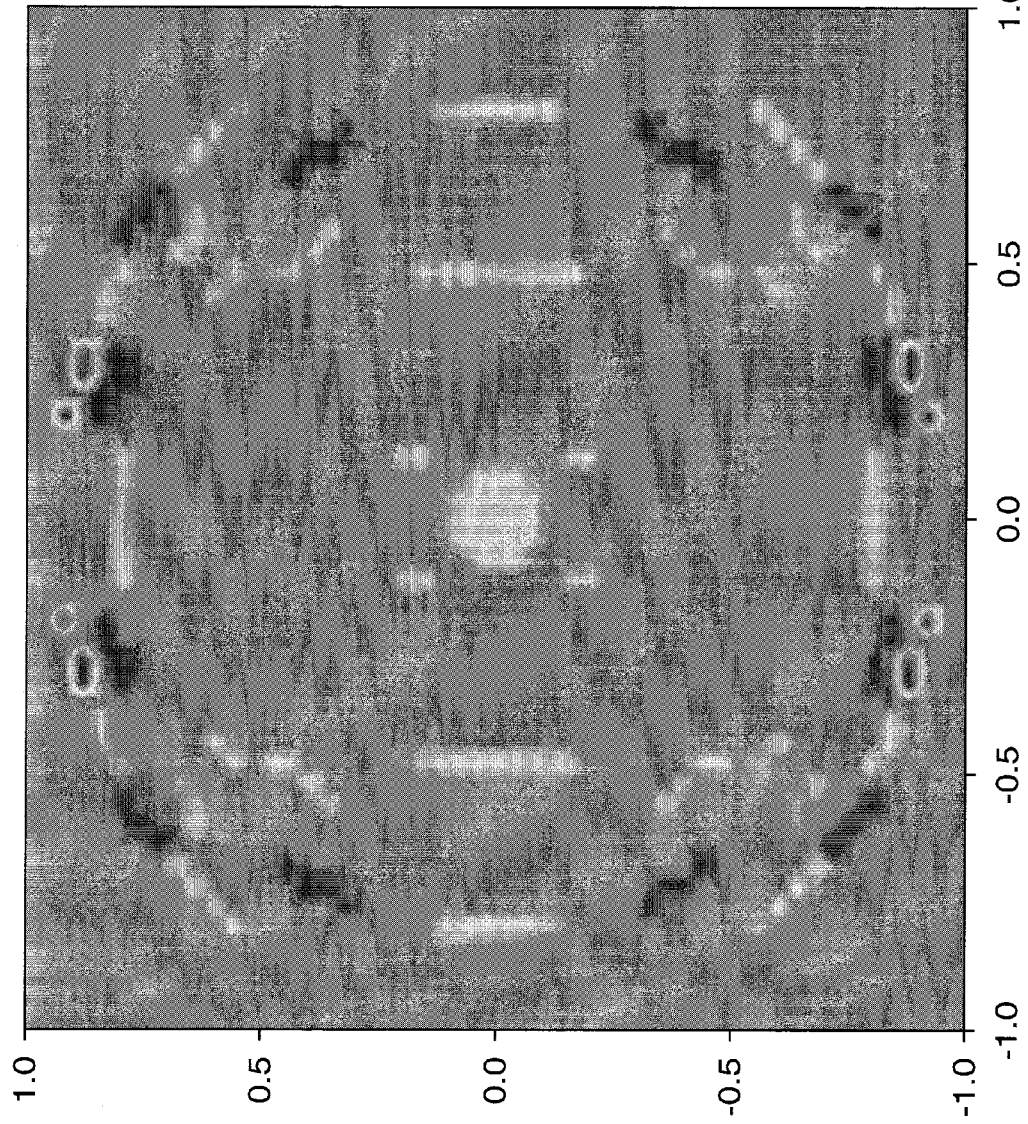

To compensate for the increase in CD error due to laser bandwidth variation, the steps in flowchart 900 are performed to adjust the illumination source in the lithographic process. FIG. 10B illustrates the adjustments that resulted. It should be noted that the adjustments depicted in FIG. 10B are grayscale adjustments, where different shades indicate different adjustments in intensity.

Figure 10C:
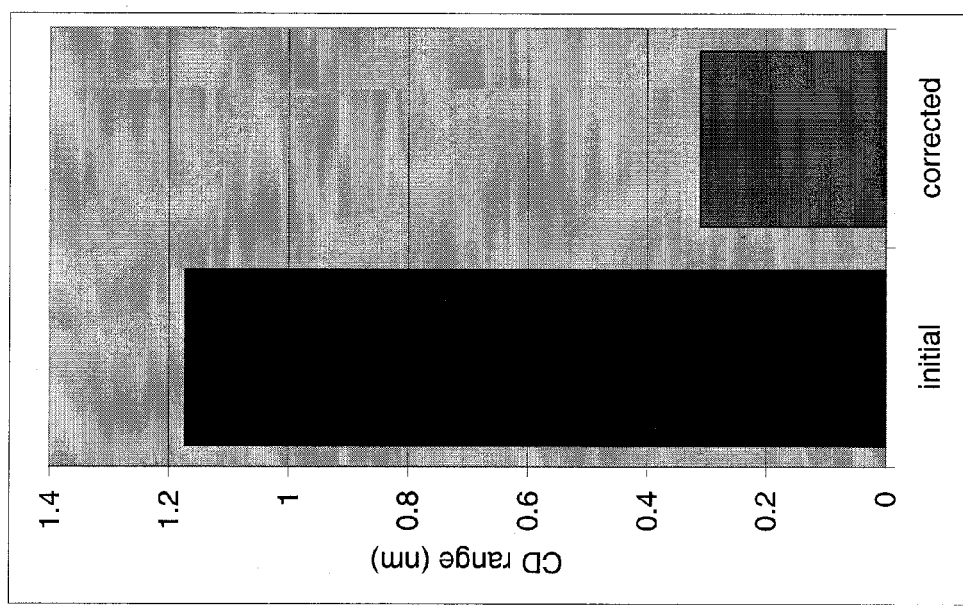
Figure 10D:
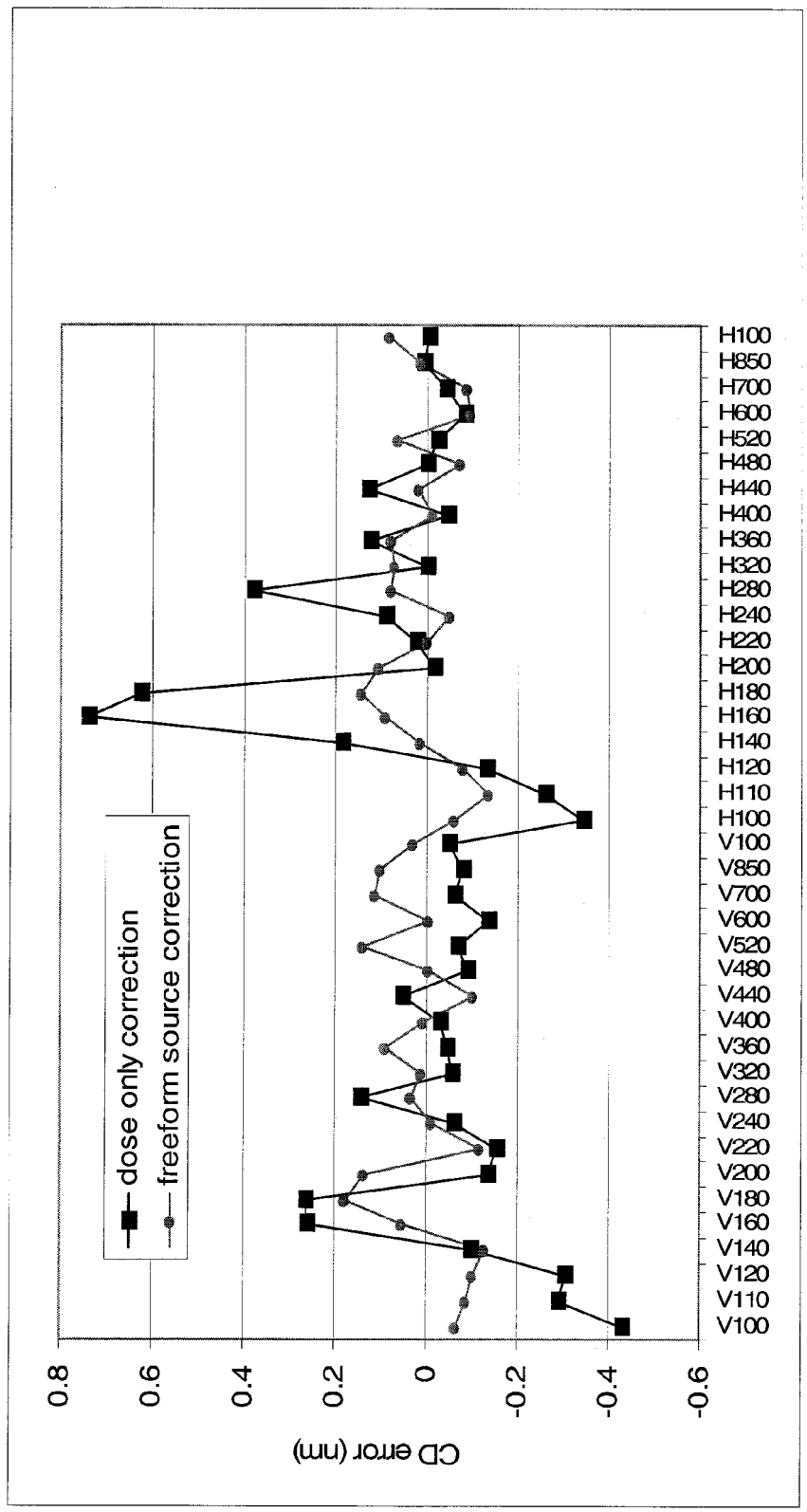

As a result of making the adjustments in FIG. 10B to the illumination source, the range of CD variations drops from nearly 1.2 nm to 0.3 nm (see FIG. 10C). FIG. 10D is a chart that compares the CD errors from a variety of feature cuts without illumination source adjustment (graph 1002) to the CD errors for the same feature cuts with the illumination source adjustments of FIG. 10B (graph 1004). It should be noted that graph 1002 depicts the same information as that in FIG. 10A. FIG. 10D illustrates the drop in CD errors that results from the adjustments to the illumination source, where the adjustments were computed based on the process outlined in FIG. 9.

According to one embodiment, in addition to adjustments to the illumination source, other adjustments may also be made. For example, adjustments may be made to the dose, numerical aperture (NA) or the scan tilt (Rx) of the lithographic apparatus. Calculations can also be made to determine the incremental effects on the lithographic metric that results from incremental adjustments to the dose, NA or Rx of the lithographic apparatus. When adjustments to the dose, NA and Rx are included, a new lithographic response can be determined by:

$$\text{new lithographic response} = \text{previous response} + \Sigma c_i S_i + n\text{NA} + r\text{Rx} + d\text{Dose}$$

where n is the coefficient of adjustment for the numerical aperture and NA is the change amount of the numerical aperture, r is the coefficient of adjustment for the tilt and Rx is the change amount of the tilt, and d is the coefficient of adjustment for the dose. It should be appreciated that other aspects of a lithographic apparatus may be similarly (e.g., dose) analyzed for incremental effects on a lithographic metric and the calculated coefficients may be similarly appended to the equation above.

According to one approach, after completion of the process outlined in flowchart 900, a form of simulated annealing may be applied to the optimized adjustment coefficients in order to find a globally optimal solution. In simulated annealing, a randomly selected subset of the adjustment coefficients that were previously determined (e.g., 10% of the total adjustment coefficients) are changed, or mutated, to different numbers, and the mutated set of adjustment coefficients are used as the initial states of the pixel groups and/or adjustments such as the NA and Rx, and the process of flowchart 900 is repeated again. The steps of performing the process in flowchart 900 and using simulated annealing to generate a new set of initial conditions may be repeated until no improvement to the new response can be made.

It will be appreciated that the different acts involved in configuring the illumination source may be executed according to machine executable instructions or codes. These machine executable instructions may be embedded in a data storage medium, e.g., of a control unit of the lithographic apparatus. The control unit may include a processor that is configured to control the adjusting device AM and to modify the cross-sectional intensity distribution in the beam exiting the illumination system IL. The processor may be configured to execute the instructions.

While much of the description has been in terms of optimization, optimization need not be performed all or part of the time or for all parts of the illumination and/or pattern/patterning device. For example, the source optimization may be performed completely or partially "sub-optimally" for expedience, due to imaging requirements, for parts of the patterning device/pattern, etc.

Software functionalities of a computer system involving programming, including executable codes, may be used to implement the above described imaging model. The software code may be executable by a general-purpose computer or a special-purpose computer. In operation, the code and possibly the associated data records may be stored within a general-purpose or special-purpose computer platform. At other times, however, the software may be stored at other locations and/or transported for loading into an appropriate general-purpose or special-purpose computer system. At other times, the software stored at a central general-purpose or special-purpose computer platform may be activated and used by users through remotely connected computers, which may include a portion of the code and possibly the associated data records. Hence, the embodiments discussed above involve one or more software or computer products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as the main memory of a computer system. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media may be involved in carrying one or more sequences of one or more instructions to a processor for execution.

While specific embodiments of the invention have been described above, it will be appreciated that the invention may be practiced other than as described. The description is not intended to limit the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The lithographic apparatus may also be of a type wherein a surface of the substrate is immersed in a liquid having a relatively high refractive index, e.g., water, so as to fill a space between a final element of the projection system and the substrate. Immersion liquids may also be applied to other spaces in the lithographic apparatus, for example between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. A method for optimizing an illumination source of a lithographic apparatus and a mask, the method comprising:
    dividing the illumination source into a plurality of pixel groups, each pixel group including one or more illumination source points;
    dividing the mask into a plurality of mask tiles;
    selecting an initial illumination shape for the illumination source;
    selecting an initial mask pattern for the mask;
    selecting an initial configuration for at least one lithographic process component;
    selecting a lithographic model for a photolithographic simulation;
    ranking pixel groups in the plurality of pixel groups and mask tiles in the plurality of mask tiles;
    for each pixel group in the plurality of pixel groups and each mask tile in the plurality of mask tiles, in order of ranking, performing the steps of:
        calculating, based on a result of the photolithographic simulation using the lithographic model, a lithographic metric as a result of an alteration in state of the each pixel group or the each mask tile;
        based on a result of the calculation, adjusting an illumination shape of the illumination source by altering a state of the each pixel group to create a modified illumination shape or adjusting a mask pattern of the mask by altering a state of the each mask tile to create a modified mask pattern.

2. The method according to claim 1, wherein:
    the step of adjusting an illumination shape of the illumination source by altering a state of at least one pixel group of the illumination source to create a modified illumination shape or adjusting a mask pattern of the mask by altering a state of at least one mask tile of the mask to create a modified mask pattern based on a result of the calculation comprises:

determining whether the calculated lithographic metric indicates an improvement over a previous lithographic metric;

in response to determining that the calculated lithographic metric indicates an improvement over the previous lithographic metric, altering the state of the each pixel group or the each mask tile and updating the previous lithographic metric to be the calculated lithographic metric, the previous lithographic metric being calculated based on highest-ranked pixel group among the plurality of pixel groups of the selected initial illumination shape of the illumination source, or highest-ranked mask tile among the plurality of mask tiles of the selected initial mask pattern.

3. The method according to claim 2, wherein the steps of selecting an initial illumination shape, selecting an initial mask pattern, ranking pixel groups and mask tiles, and calculating a lithographic metric and adjusting the illumination source or mask pattern for each pixel group and mask tile are repeated iteratively until a convergence of the lithographic metric, the modified illumination shape for a current iteration used as the initial illumination shape for a next iteration and the modified mask pattern for a current iteration used as the initial mask pattern for a next iteration.

4. A method according to claim 2, wherein the step of calculating a lithographic metric as a result of an alteration in state is preceded by a step of adjusting the mask pattern of the mask by iteratively adjusting mask polygons of the mask pattern of the mask.

5. A method according to claim 2, further comprising:
for each pair of pixel groups of the illumination source, performing the steps of:
calculating the lithographic metric as a result of an alteration in state from a current state to a new state of each pixel group in the each pair of pixel groups;
based on a comparison between the lithographic metric and a current lithographic metric, the current lithographic metric calculated based on the current state of each pixel group of the each pair of pixel groups, determining whether to adjust the illumination source; and
in response to determining to adjust the illumination source, adjusting the illumination source by altering the current state of each pixel group in the each pair of pixel groups to the new state and updating the current lithographic metric to be the calculated lithographic metric.

6. A method according to claim 1, wherein the initial illumination shape and the initial mask pattern are determined through one or more of experimentation, photolithographic simulation, and a grid search.

7. A method according to claim 1, wherein the lithographic model comprises one or more of the following: a calibrated resist model, a lumped parameter model (LPM), and, an aerial image model or an image-in-film model.

8. A method according to claim 1, wherein the illumination source is divided into pixel groups based on a symmetry of a pattern of the illumination source.

9. A method according to claim 1, wherein the state of a mask tile is one of the following: one-transmission, one-transmission with a 0-degree phase shift, zero-transmission, and a partial transmission with a 180-degree phase shift.

10. A method according to claim 1, wherein the lithographic metric comprises one or more of: a critical dimension uniformity of the lithography pattern, a process window, a dimension of the process window, MEEF, maximum NILS, maximum NILS in defocus, edge placement error, process variation bandwidth, worst deviation in a process corner, or a pattern fidelity metric.

11. A method according to claim 10, wherein the lithographic metric is user-defined.

12. A method according to claim 11, wherein the pattern fidelity metric accounts for assist feature printing, sidelobe printing, feature shape errors, or feature displacement errors.

13. A method according to claim 1, wherein the lithographic metric is calculated over an assumed budget of errors.

14. A method according to claim 13, wherein the errors include a mask error, a dose error and a focus error.

15. A method according to claim 1, wherein ranking pixel groups in the plurality of pixel groups and mask tiles in the plurality of mask tiles comprises:
determining, for each pixel group in the plurality of pixel groups and each mask tile in the plurality of mask tiles, a linear sensitivity value that indicates how an alteration in state of the each pixel group or the each mask tile from an initial state affects the lithographic metric;
ranking, based on the linear sensitivity values of the pixel groups and the mask tiles, the pixel groups and the mask tiles.

16. A method according to claim 15, wherein ranking, based on the linear sensitivity values of the pixel groups and the mask tiles, the pixel groups and the mask tiles comprises:
ranking a first pixel group or mask tile higher than a second pixel group or mask tile in response to determining that the linear sensitivity values of the first pixel group or mask tile and the second pixel group or mask tile indicate that an alteration in state of the first pixel group or mask tile results in a larger improvement to the lithographic metric than an alteration in state of the second pixel group or mask tile.

17. A non-transitory computer program product having machine executable instructions, the instructions being executable by a machine to perform a method for optimizing an illumination source of a lithographic apparatus and a mask, the method comprising:
dividing the illumination source into a plurality of pixel groups, each pixel group including one or more illumination source points;
dividing the mask into a plurality of mask tiles;
selecting an initial illumination shape for the illumination source;
selecting an initial mask pattern for the mask;
selecting an initial configuration for at least one lithographic process component;
selecting a lithographic model for a photolithographic simulation;
ranking pixel groups in the plurality of pixel groups and mask tiles in the plurality of mask tiles;
for each pixel group in the plurality of pixel groups and each mask tile in the plurality of mask tiles, in order of ranking, performing the steps of:
calculating, based on a result of the photolithographic simulation using the lithographic model, a lithographic metric as a result of an alteration in state of the each pixel group or the each mask tile;
based on a result of the calculation, adjusting an illumination shape of the illumination source by altering a state of the each pixel group to create a modified illumination shape or adjusting a mask pattern of the mask by altering a state of the each mask tile to create a modified mask pattern.

18. A lithographic apparatus comprising:
- an illumination system configured to condition a beam of radiation;
- a substrate table configured to hold a substrate;
- a projection system configured to project the beam of radiation patterned by a patterning device onto a surface of the substrate; and
- a processor to perform a method for optimizing an illumination source of the lithographic apparatus and a mask, the method comprising:
  - dividing the illumination source into a plurality of pixel groups, each pixel group including one or more illumination source points;
  - dividing the mask into a plurality of mask tiles;
  - selecting an initial illumination shape for the illumination source;
  - selecting an initial mask pattern for the mask;
  - selecting an initial configuration for at least one lithographic process component;
  - selecting a lithographic model for a photolithographic simulation;
  - ranking pixel groups in the plurality of pixel groups and mask tiles in the plurality of mask tiles;
  - for each pixel group in the plurality of pixel groups and each mask tile in the plurality of mask tiles, in order of ranking, performing the steps of:
    - calculating, based on a result of the photolithographic simulation using the lithographic model, a lithographic metric as a result of an alteration in state of the each pixel group or the each mask tile;
    - based on a result of the calculation, adjusting an illumination shape of the illumination source by altering a state of the each pixel group to create a modified illumination shape or adjusting a mask pattern of the mask by altering a state of the each mask tile to create a modified mask pattern.

19. A method for configuring an illumination source of a lithographic apparatus, the method comprising:
- determining, for each pixel group in a plurality of pixel groups, a linear sensitivity value that indicates how an alteration in state of the each pixel group from an initial state affects a lithographic response;
- until the lithographic response converges, repeating the steps of:
  - for each pixel group in the plurality of pixel groups, calculate the lithographic response based on the linear sensitivity value of the each pixel group;
  - altering a state of a particular pixel group to an updated state, the calculated lithographic response for the particular pixel group indicating a greater amount of improvement over a current lithographic response than a calculated lithographic responses for pixel groups other than the particular pixel group, the current lithographic response calculated based on current states of the pixel groups; and
  - updating the current lithographic response based on the updated state of the particular pixel group.

20. A method according to claim 19, wherein:
- the step of updating the current lithographic response is preceded by a step of adjusting at least one of a numerical aperture and a tilt of the lithographic apparatus; and
- the step of updating the current lithographic response includes updating the current lithographic response based on at least one of: an adjusted numerical aperture and an adjusted tilt of the lithographic apparatus.

* * * * *